(12) United States Patent
Gardner et al.

(10) Patent No.: US 12,249,659 B2
(45) Date of Patent: Mar. 11, 2025

(54) 2D MATERIALS WITH INVERTED GATE ELECTRODE FOR HIGH DENSITY 3D STACKING

(71) Applicant: Tokyo Electron Limited, Tokyo (JP)

(72) Inventors: Mark I. Gardner, Albany, NY (US); H. Jim Fulford, Albany, NY (US)

(73) Assignee: Tokyo Electron Limited, Tokyo (JP)

(*) Notice: Subject to any disclaimer, the term of this patent is extended or adjusted under 35 U.S.C. 154(b) by 582 days.

(21) Appl. No.: 17/578,397

(22) Filed: Jan. 18, 2022

(65) Prior Publication Data

US 2023/0231057 A1 Jul. 20, 2023

(51) Int. Cl.
| | |
|---|---|
| *H01L 27/12* | (2006.01) |
| *H01L 21/8234* | (2006.01) |
| *H01L 29/792* | (2006.01) |
| *H10B 43/27* | (2023.01) |

(52) U.S. Cl.
CPC .. *H01L 29/7926* (2013.01); *H01L 21/823431* (2013.01); *H01L 27/1225* (2013.01); *H10B 43/27* (2023.02)

(58) Field of Classification Search
None
See application file for complete search history.

(56) References Cited

U.S. PATENT DOCUMENTS

| | | | |
|---|---|---|---|
| 9,024,376 B2 | 5/2015 | Masuoka et al. | |
| 9,425,324 B2 | 8/2016 | Diaz et al. | |
| 9,478,624 B2 | 10/2016 | Colinge et al. | |
| 10,756,205 B1* | 8/2020 | Xu | H01L 21/31116 |
| 2010/0051960 A1* | 3/2010 | Chen | H01L 29/66742 438/105 |
| 2012/0181510 A1* | 7/2012 | Avouris | H01L 29/78684 977/734 |
| 2018/0012962 A1* | 1/2018 | Yeh | H01L 29/66795 |
| 2020/0185532 A1* | 6/2020 | Lin | H01L 21/02568 |
| 2020/0388685 A1* | 12/2020 | Sharma | H01L 29/785 |
| 2021/0057558 A1* | 2/2021 | Pritchard | H01L 29/78681 |
| 2021/0119131 A1* | 4/2021 | Vasen | H10K 10/472 |
| 2021/0408296 A1* | 12/2021 | Zhong | H01L 29/66742 |
| 2022/0173099 A1* | 6/2022 | Kim | H01L 29/516 |
| 2022/0238692 A1* | 7/2022 | Nguyen | H01L 21/304 |
| 2022/0319982 A1* | 10/2022 | Hu | H01L 21/823475 |
| 2022/0384656 A1* | 12/2022 | Lee | H01L 21/02565 |
| 2023/0361175 A1* | 11/2023 | Xu | H01L 21/02301 |

* cited by examiner

*Primary Examiner* — Benjamin P Sandvik
(74) *Attorney, Agent, or Firm* — Foley & Lardner LLP

(57) ABSTRACT

A semiconductor device may include a first dielectric layer, a first gate electrode, a first gate dielectric layer, a first source electrode, a first drain electrode, and a first two-dimensional (2D) semiconductor layer. The first dielectric layer may have a first top surface. The first gate electrode may extend from the first top surface into the first dielectric layer. The first gate dielectric layer may be disposed on the first gate electrode and have a second top surface. The first source electrode may extend from the second top surface, through the first gate dielectric layer and into the first dielectric layer. The first drain electrode may extend from the second top surface, through the first gate dielectric layer and into the first dielectric layer. The first 2D semiconductor layer may be disposed on the first gate dielectric layer.

17 Claims, 20 Drawing Sheets

2D MATERIALS WITH INVERTED GATE ELECTRODE FOR HIGH DENSITY 3D STACKING

TECHNICAL FIELD

The present disclosure relates generally to the field of manufacturing semiconductor devices, and more particularly to a device with an inverted gate electrode and a two-dimensional (2D) material for three-dimensional (3D) stacking and method for manufacturing the same.

BACKGROUND

In the manufacture of semiconductor devices, various fabrication processes are executed, such as film-forming depositions, etch mask creation, patterning, material etching and removal, and doping treatments. These processes may be performed to form semiconductor device components on a substrate. Some example fabrication techniques allow the manufacture of transistors on a single active device plane, while wiring or metallization is formed above the active device plane. Such devices are accordingly characterized as 2D circuits, manufactured using 2D fabrication techniques.

Fabrication processes of stacking a plurality of devices to manufacture a three-dimensional (3D) device allow for high density circuits. Although scaling efforts have greatly increased the number of transistors per unit area in 2D circuits, improvements in stacking 2D circuits to manufacture a 3D device remains desired.

SUMMARY

As technology continues to advance and transistor features of planar devices approach theoretical limits, there is a growing desire to find new structures, materials, and/or processes that advance Moore's Law without compromising various aspects. An area of growing interest is using nanosheets with materials that are no thicker than several hundreds of nanometers down to 2D semiconductors having thicknesses of one atomic layer. Fabricating semiconductor devices like transistors and memories using these types of materials may pose great challenges for manufacturers. Accordingly, there is a desire to find different materials and structures that can be fabricated using reliable processes. Moreover, fabrication processes of stacking a plurality of devices to manufacture a three-dimensional (3D) device allow for high density circuits. Although scaling efforts have greatly increased the number of transistors per unit area in 2D semiconductor devices, improvements in stacking 2D circuits to manufacture a 3D device remains desired.

To solve these problems, according to certain aspects, embodiments herein relate to techniques for improving processes of designing and/or manufacturing 3D devices by stacking a plurality of 2D semiconductor devices, thereby enabling higher density circuits to be produced at reduced cost. Some embodiments relate to methods for growing and/or depositing 2D materials for a 3D stacking structure. Examples of 2D materials include, but are not limited to, (1) W-based 2D materials (e.g., $WS_2$, $WSe_2$, $WTe_2$), (2) Mo-based 2D materials (e.g., $MoS_2$, $MoSe_2$, $MoTe_2$), or (3) other 2D materials such as $HfS_2$, $ZrS_2$, $TiS_2$, GaSe, InSe, phosphorene. In some embodiments, a device may include a 2D semiconductor layer which is one monolayer for 2D materials for a minimum thickness.

A gate electrode may be formed before a source electrode and/or a drain electrode, thereby manufacturing a perfectly planar device with 2D channel regions. This also enables multiple 3D devices (e.g., multiple transistors) to be stacked vertically.

A first transistor with a first conductive type (e.g., an NMOS (n-channel metal-oxide semiconductor) and a second transistor with a second conductive type (e.g., a PMOS (p-channel metal-oxide semiconductor)) may be manufactured in a unit cell using a side-by-side structure in which the first transistor and second transistor may be side by side or otherwise laterally formed or disposed with respect to each other. In some embodiments, a 3D device may be manufactured by stacking a plurality of such first and second transistors each using one or more 2D materials and a side-by-side structure.

A complementary field-effect transistor (CFET) may be manufactured in a unit cell using one or more 2D materials. In some embodiments, the CFET may include a first transistor with a first conductive type (e.g., a PMOS) stacked over a second transistor with a second conductive type (e.g., an NMOS). In some embodiments, the CFET may include an NMOS stacked over a PMOS. In some embodiments, a 3D device may be manufactured by stacking a plurality of such CFETs each being manufactured using one or more 2D materials.

Embodiments in the present disclosure may provide useful techniques for manufacturing a 2D device or circuit by forming a gate electrode before a source electrode or a drain electrode, thereby manufacturing a perfectly planar device with 2D channel regions. This also enables multiple 3D devices (e.g., multiple transistors) to be stacked vertically.

Embodiments in the present disclosure may provide useful techniques for using 2D materials which have greatly enhanced mobility relative to a single crystal silicon.

Embodiments in the present disclosure may provide useful techniques for manufacturing CMOS (complementary metal-oxide-semiconductor) integrated circuits including one or more 2D materials with relatively fewer process steps (compared to conventional manufacturing process), thereby enabling manufacturing CMOS integrated circuits with high performance and robustness.

In one embodiment, a semiconductor device may include a gate electrode; a gate dielectric layer disposed on the first gate electrode; a two-dimensional (2D) semiconductor layer disposed on the gate dielectric layer; a source electrode extending through the gate dielectric layer to the 2D semiconductor layer; and a drain electrode extending through the gate dielectric layer and to the 2D semiconductor layer.

The semiconductor device may further include a gate contact extending through the 2D semiconductor layer and the gate dielectric layer to the gate electrode. A dielectric liner may be around the gate contact. The gate electrode, the source electrode, and the drain electrode may be terminals of a transistor structure having a conductive type. The semiconductor device may further include a second transistor structure disposed above the transistor structure. The transistor structure may have a first conductive type, and the second transistor structure may have a second conductive type. The semiconductor device may further include a second gate dielectric layer disposed on the 2D semiconductor layer and a second gate electrode disposed on the second gate dielectric layer.

In another embodiment, a method for fabricating semiconductor devices may comprise forming a gate electrode; forming a gate dielectric layer on the first gate electrode; forming a source electrode and a drain electrode extending through the gate dielectric layer; and forming a two-dimensional (2D) semiconductor layer disposed on the gate dielectric layer, the source electrode, and the drain electrode.

The method may further include forming a gate contact extending through the 2D semiconductor layer and the gate dielectric layer to the gate electrode. Forming the gate contact may further comprise forming a dielectric around the gate contact. The gate electrode, the source electrode, and the drain electrode may be terminals of a transistor structure. The method may further include forming a second transistor structure above the transistor structure. The transistor structure may have a first conductive type, and the second transistor structure may have a second conductive type. The method may further include forming a second gate dielectric layer on the 2D semiconductor layer, and forming a second gate electrode on the second gate dielectric layer.

In yet another embodiment, a method for fabricating semiconductor devices may comprise forming a first gate electrode; forming a second gate electrode; forming a gate dielectric layer extending across a top surface of the first gate electrode and the second gate electrode; forming a first source electrode and a first drain electrode extending through the first gate dielectric layer; forming a second source electrode and a second drain electrode extending through the first gate dielectric layer; forming a first two-dimensional (2D) semiconductor layer on the first gate dielectric layer, the first gate electrode, and the second gate electrode; and forming a second 2D semiconductor layer on the first gate dielectric layer, the second source electrode, and the second drain electrode.

The method may further include removing the first 2D semiconductor layer on the second source electrode and second drain electrode before forming the second 2D semiconductor layer. The method may further include isolating the first 2D semiconductor layer, the first gate electrode, the first source electrode, and the first drain electrode from the second 2D semiconductor layer, the second gate electrode, the second source electrode, and the second drain electrode. After forming the first 2D semiconductor layer, the second 2D semiconductor layer may be formed. The first 2D semiconductor layer may have a first conductive type, and the second semiconductive layer may have a second conductive type. The method may further include forming a first gate contact extending through the first 2D semiconductor layer and the first gate dielectric layer to the first gate electrode; and forming a first source contact extending through the first 2D semiconductor layer and the first gate dielectric layer to the first source electrode; and forming a first drain contact extending through the first 2D semiconductor layer and the first gate dielectric layer to the first drain electrode.

These and other aspects and implementations are discussed in detail below. The foregoing information and the following detailed description include illustrative examples of various aspects and implementations, and provide an overview or framework for understanding the nature and character of the claimed aspects and implementations. The drawings provide illustration and a further understanding of the various aspects and implementations, and are incorporated in and constitute a part of this specification. Aspects can be combined and it will be readily appreciated that features described in the context of one aspect of the present disclosure can be combined with other aspects. Aspects can be implemented in any convenient form. As used in the specification and in the claims, the singular form of 'a', 'an', and 'the' include plural referents unless the context clearly dictates otherwise.

BRIEF DESCRIPTION OF THE DRAWINGS

Non-limiting embodiments of the present disclosure are described by way of example with reference to the accompanying figures, which are schematic and are not intended to be drawn to scale. Unless indicated as representing the background art, the figures represent aspects of the disclosure. For purposes of simplicity, not every component may be labeled in every drawing. In the drawings.

DETAILED DESCRIPTION

Reference will now be made to the figures, which for the convenience of visualizing the 3D fabrication techniques described herein, illustrate a substrate undergoing a process flow in both top and cross-sectional views. Unless expressly indicated otherwise, each Figure represents one (or a set) of fabrication steps in a process flow for manufacturing the devices described herein. In the top and cross-sectional views of the Figures, connections between conductive layers or materials may be shown. However, it should be understood that these connections between various layers and masks are merely illustrative, and are intended to show a capability for providing such connections and should not be considered limiting to the scope of the claims.

Likewise, although the Figures and aspects of the disclosure may show or describe devices herein as having a particular shape, it should be understood that such shapes are merely illustrative and should not be considered limiting to the scope of the techniques described herein. For example, although most of the figures show various layers in a planar and/or rectangular configuration, other shapes are also contemplated, and indeed the techniques described herein may be implemented in any shape or geometry. As an example, non-continuous contact shapes, such as arcs or polygonal trenches, may be adjacent to, partially surround, or fully surround a central channel in addition to or as an alternative to the ring shapes illustrated. In addition, examples in which two transistors or devices are shown stacked on top of one another are shown for illustrative purposes only, and for the purposes of simplicity. Indeed, the techniques described herein may provide for one to any number N stacked devices. Further, although the devices fabricated using these techniques are shown as transistors, it should be understood that any type of electric electronic device may be manufactured using such techniques, including but not limited to transistors, variable resistors, resistors, and capacitors.

Figure 1:
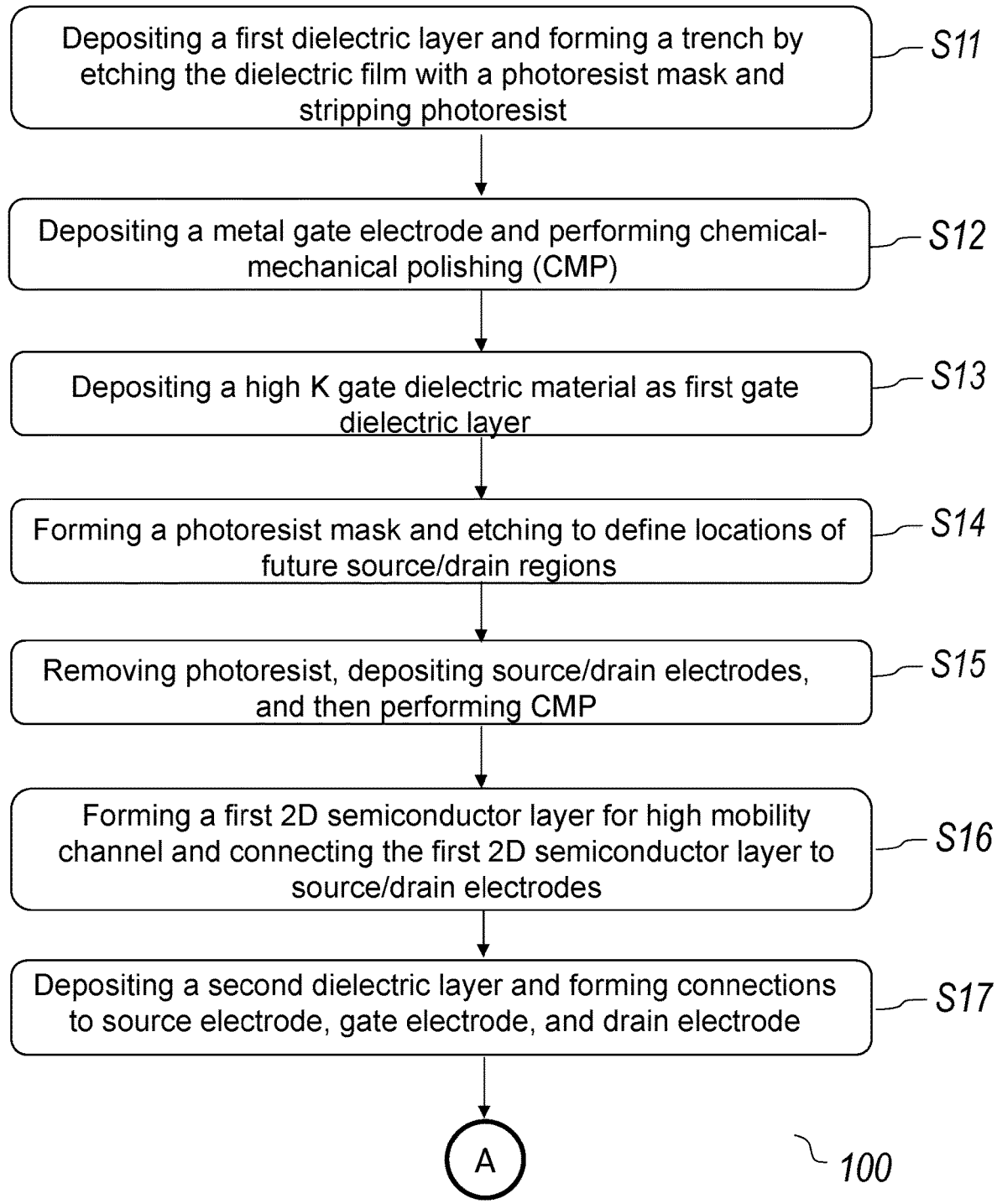
FIG. 1 illustrates a flowchart of a process for forming an example semiconductor device, in accordance with some embodiments.

FIG. 1 illustrates a flowchart of a process 100 for forming an example semiconductor device (e.g., transistor), in accordance with some embodiments. It is noted that the process 100 is merely an example, and is not intended to limit the present disclosure. Accordingly, it is understood that additional operations may be provided before, during, and after the process 100 of FIG. 1, and that some other operations may only be briefly described herein. In some embodiments, the process 100 may form a 2D material (e.g., 2D semiconductor layer 210 in FIGS. 2F and 2G) with an inverted gate electrode (e.g., gate electrode 204 in FIG. 2G) for high density 3D stacking using different metals for the gate electrode and source/drain regions to manufacture a side-by-side CMOS integrated circuit (e.g., an integrated circuit having a number of NMOS transistors and a number of PMOS transistors side-by-side or otherwise laterally arranged with each other).

FIGS. 2A-2G show cross-sectional views of a semiconductor device 200 being manufactured at different stages of the process of FIG. 1, in accordance with some embodiments.

Figure 2A:
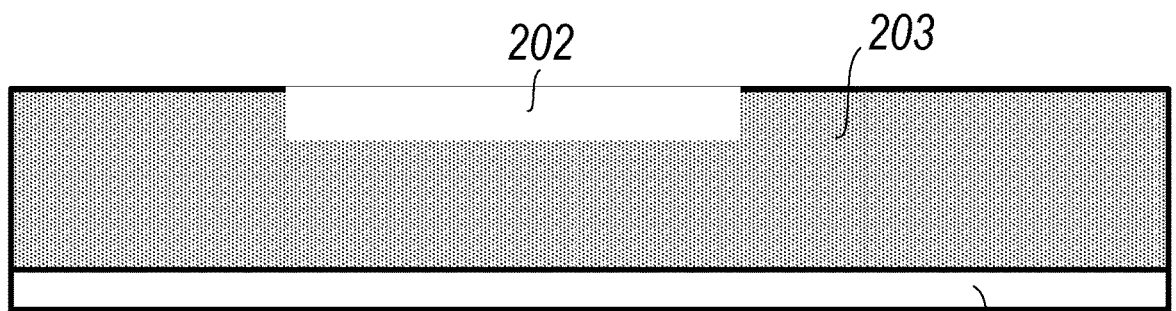
FIGS. 2A-2G show cross-sectional views of a semiconductor device being manufactured at different stages of the process of FIG. 1, in accordance with some embodiments.
Figure 2B:
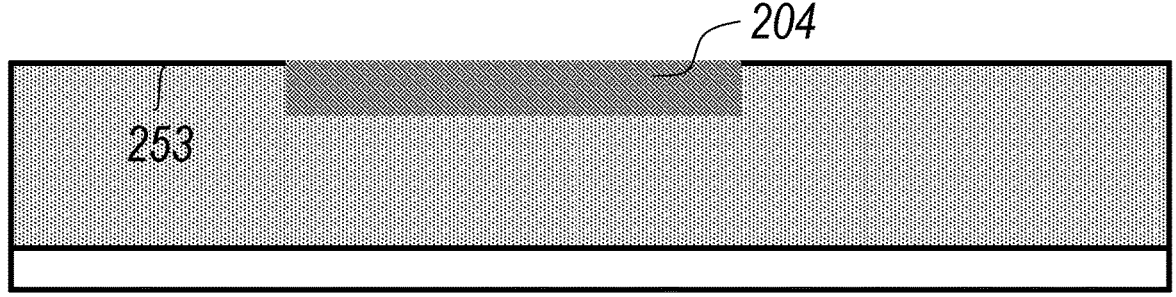
Figure 2C:
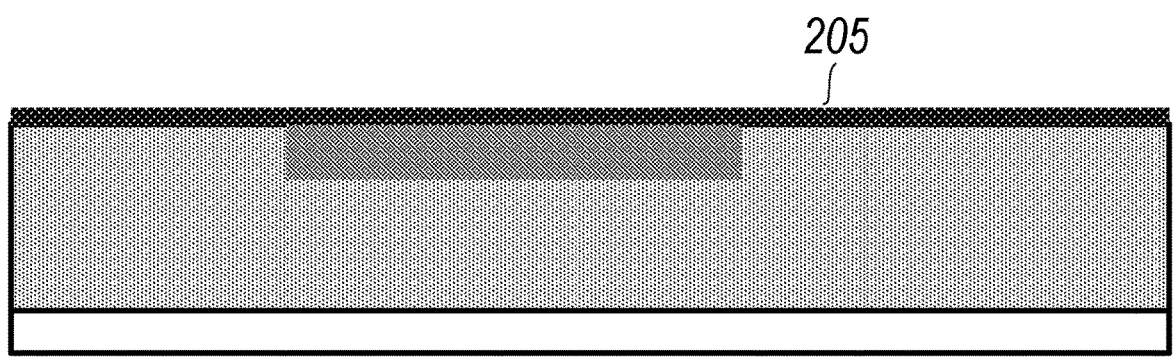
Figure 2D:
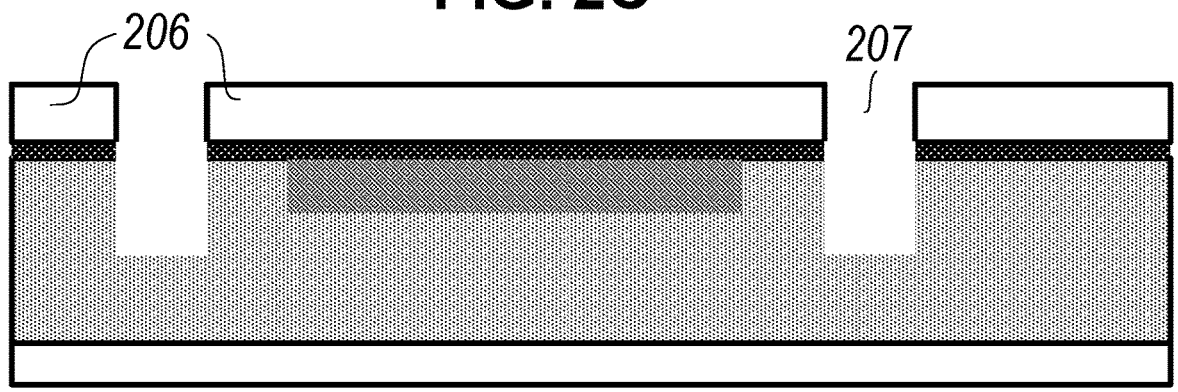
Figure 2E:
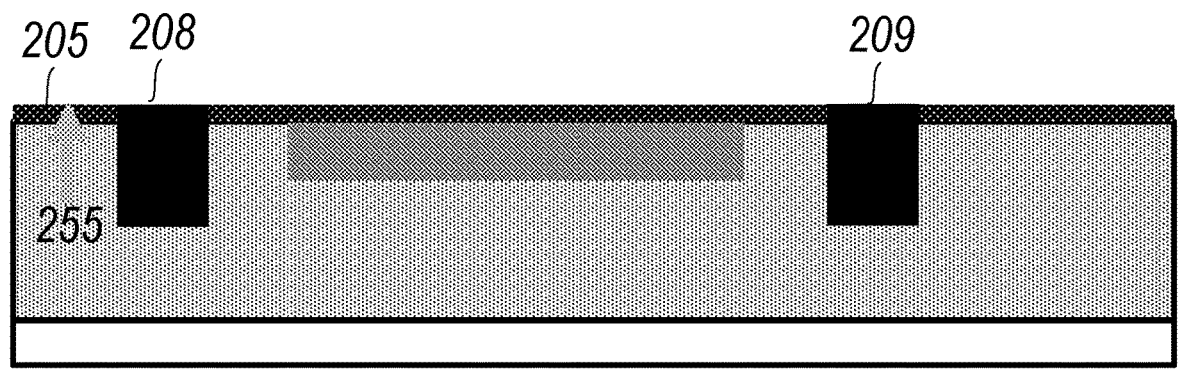
Figure 2F:
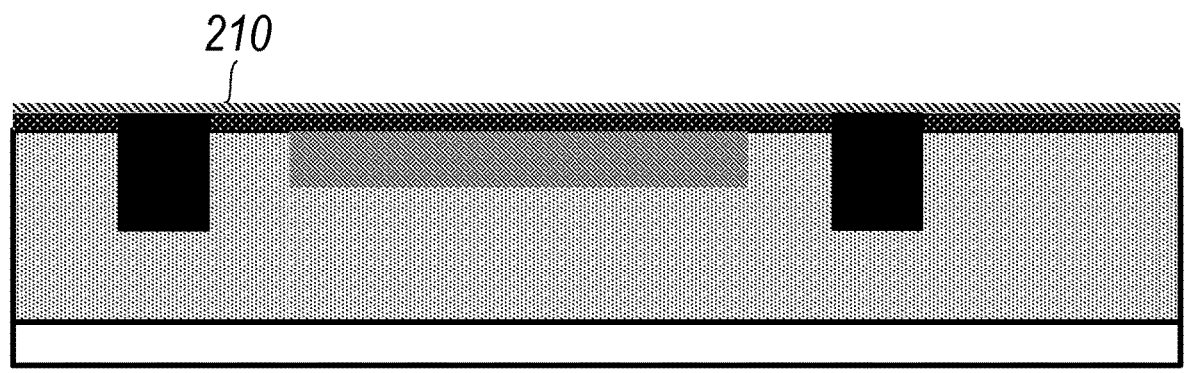
Figure 2G:
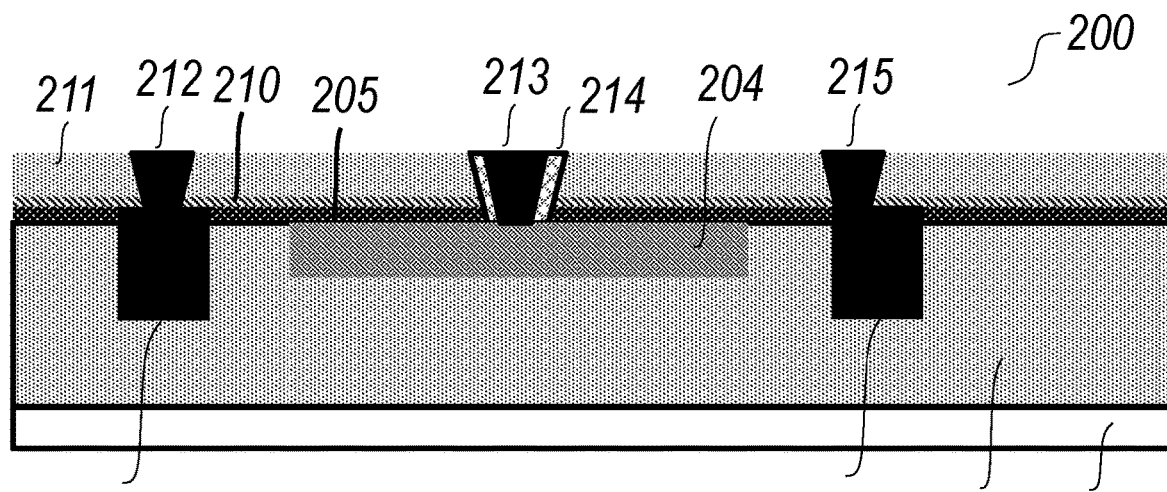

As shown in FIG. 2G, the semiconductor device 200 as a result of performing the process 100 according to some embodiments. In some embodiments, the semiconductor device 200 may be an NMOS transistor or a PMOS transistor manufactured with its electrodes (e.g., source, gate, drain) disposed on the same side of its channel (e.g., a 2D semiconductor layer). With such a configuration, a number of the disclosed semiconductor devices 200, with the same conductive type or different conductive types, can be vertically stacked and/or laterally arranged to form an integrated circuit, which will be discussed in further detail below.

Referring to FIG. 2G, the semiconductor device 200 may include a substrate 201, a first dielectric layer 203, a gate electrode 204 (first gate electrode), a high-k (high dielectric constant) gate dielectric material 205 (first gate dielectric layer), a source electrode 208, a drain electrode 209, a first 2D semiconductor layer 210, a second dielectric layer 211, a source contact 212, a gate contact 213, a dielectric via liner 214, and/or drain contact 215. In some embodiments, the first 2D semiconductor layer 210 may be selected from the group consisting of: $WS_2$, $WSe_2$, $WTe_2$, $MoS_2$, $MoSe_2$, $MoTe_2$, $HfS_2$, $ZrS_2$, $TiS_2$, GaSe, InSe, phosphorene, and combinations thereof. Other materials may alternatively be utilized. Additionally or alternatively, the techniques provided herein may utilize semiconductive behaving oxides (sometimes referred to herein as "conductive oxides"), which may have similar properties to semiconductor materials, to fabricate vertical 3D transistors. For example, certain materials, when combined with oxygen, may form new materials that exhibit semiconductor properties (e.g., can turn "off" with low off-state leakage current or can become highly conductive under certain circumstances). Some examples of N-type semiconductive behaving oxides include $In_2O_3$, $SnO_2$, InGaZnO, and ZnO. One example of a P-type conductive channel is SnO. For the sake of simplicity, the use of 2D semiconductor materials will be disclosed.

Referring to FIG. 2G, in some embodiments, the first 2D semiconductor layer 210 may be disposed on the first gate dielectric layer 205. The second dielectric layer 211 may be disposed on the first 2D semiconductor layer 210. The gate contact 213 may extend through the second dielectric layer 211, the first 2D semiconductor layer 210, and the first gate dielectric layer 205. The dielectric via liner 214 may be formed such that it is around gate contact 213, e.g., lining sidewalls of the gate contact to isolate the gate contact 213 from the first 2D semiconductor layer 210 and the first gate dielectric layer 205. The dielectric via liner 214 may be formed or disposed between the gate contact 213 and the first 2D semiconductor layer 210.

Operations of the process 100 associated with cross-sectional views of an example semiconductor device at various fabrication stages as shown in FIGS. 2A-2G, respectively, are described in further detail herein below. Corresponding to operation S11, FIG. 2A illustrates a resulting cross-sectional view of the semiconductor device 200 after (1) depositing a first dielectric layer 203 on a substrate 201, (2) forming a trench 202 by etching the dielectric layer 203 with a photoresist mask (not shown), and (3) stripping the photoresist mask.

Corresponding to operation S12, FIG. 2B illustrates a resulting cross-sectional view of the semiconductor device 200 after depositing a metal gate electrode (first gate electrode) 204 into the trench 202, and performing chemical-mechanical polishing (CMP). In some embodiments, the metal gate electrode may include a stack of metals. For example, the metal gate includes a number of metal layers stacked on top of one another. In some embodiments, different regions of a wafer may have different metals as options for both materials and width/length (W/L) options, which allows multiple transistors, each having its respective characteristic (e.g., a threshold voltage, a conduction current ($I_{on}$), etc.), to be formed on the wafer. In some embodiments, the first dielectric layer 203 may have a first top surface 253. The first gate electrode 204 may extend from the first top surface 253 into the first dielectric layer 203. In some embodiments, the first gate electrode 204 may be formed to recess into the first dielectric layer 203.

Corresponding to operation S13, FIG. 2C illustrates a resulting cross-sectional view of the semiconductor device 200 after depositing a high-k gate dielectric material 205 as first gate dielectric layer 205 on the first dielectric layer 203 and the first gate electrode 204.

Corresponding to operation S14, FIG. 2D illustrates a resulting cross-sectional view of the semiconductor device 200 after forming a photoresist mask 206 and etching the first gate dielectric layer 205 and the first dielectric layer 203 to form trenches 207, which may define (future) regions of source/drain electrodes.

Corresponding to operation S15, FIG. 2E illustrates a resulting cross-sectional view of the semiconductor device 200 after (1) removing the photoresist mask 206, (2) depositing metals for the source electrode 208 and the drain electrode 209, and then (3) performing CMP. In some embodiments, the first gate dielectric layer 205 may be disposed on the first gate electrode 204 and have a second top surface 255. The first source electrode 208 may extend from the second top surface 255, through the first gate dielectric layer 205 and into the first dielectric layer 203. Similarly, the first drain electrode 209 may extend from the second top surface 255, through the first gate dielectric layer 205 and into the first dielectric layer 203. In some embodiments, the first source electrode 208 and the first drain electrode 209 may be formed to extend through the first gate dielectric layer 205 and into the first dielectric layer 203.

Corresponding to operation S16, FIG. 2F illustrates a resulting cross-sectional view of the semiconductor device 200 after forming the first 2D semiconductor layer 210 for high mobility channel and connecting the first 2D semiconductor layer 210 to the source electrode 208 and the drain electrode 209, thereby forming a planar device due to the feature of inverted gate electrode. In some embodiments, the first 2D semiconductor layer 210 may be formed or disposed on the first gate dielectric layer 205. In some embodiments, the process 100 may perform a step of annealing the 2D semiconductor layer.

Corresponding to operation S17, FIG. 2G illustrates a resulting cross-sectional view of the semiconductor device 200 after depositing a second dielectric layer 211 and forming a source contact (or connection) 212, a gate contact 213 and a drain contact 215 in contact with the source electrode 208, the gate electrode 204 and the drain electrode 209, respectively. In some embodiments, the second dielectric layer 211 may be disposed on the first 2D semiconductor layer 210. The gate contact 213 may extend through the second dielectric layer 211, the first 2D semiconductor layer 210, and the first gate dielectric layer 205. In some embodiments, a dielectric via liner 214 may be formed on the sidewalls of the second dielectric layer 211 so as to electrically isolate the gate contact 213 from the first 2D semiconductor layer 210. In some embodiments, a gate contact opening (not shown) may be first formed in the first 2D semiconductor layer 210 and the first gate dielectric layer 205. The second dielectric layer 211 may then be formed on the gate electrode 204 within the contact opening formed in layers 210 and 205. A smaller gate contact opening (not shown) may then be formed such that a portion of the second dielectric layer 211 insulates the gate contact 213 from the first 2D semiconductor layer 210.

Figure 3:
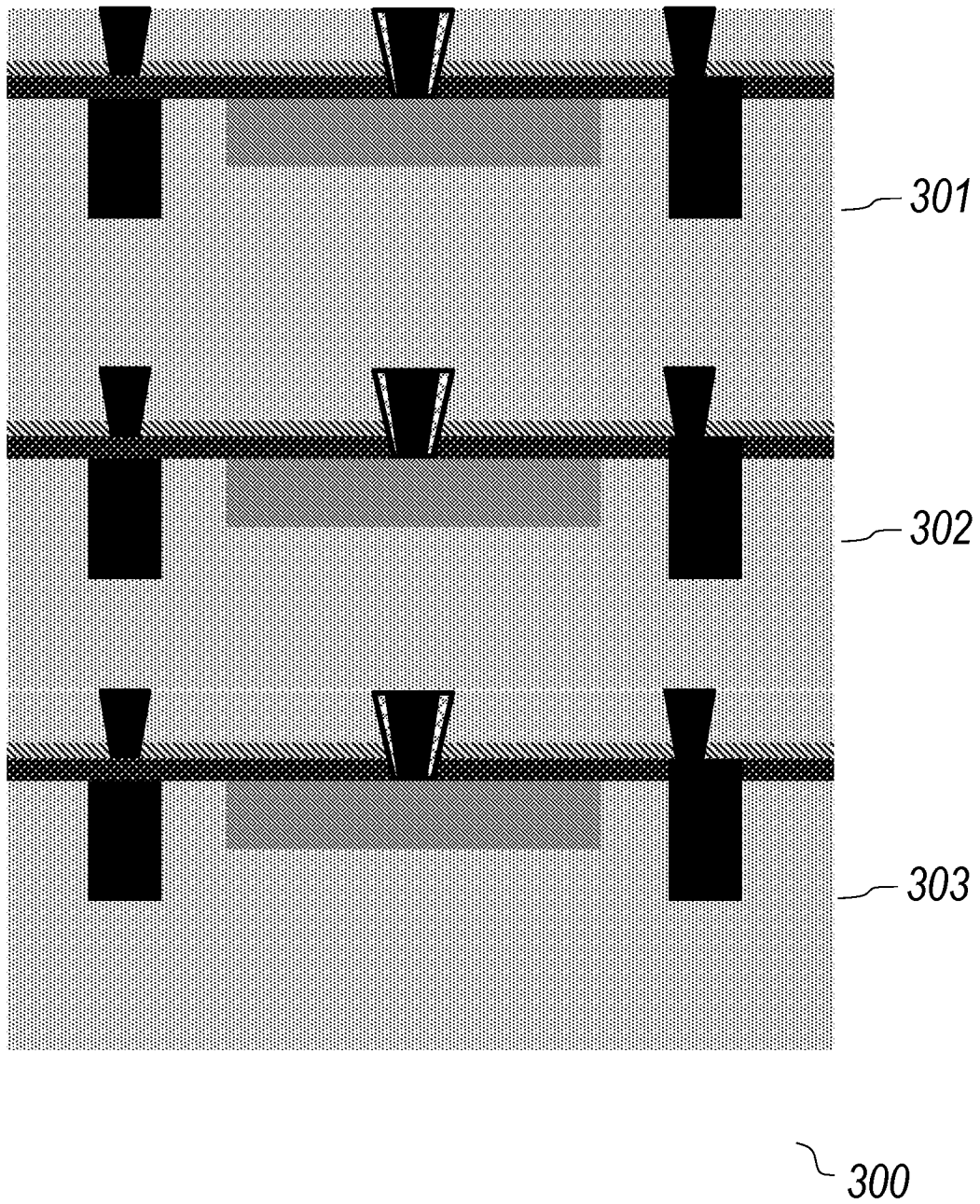
FIG. 3 illustrates a cross-sectional view of a semiconductor device in accordance with some embodiments.

FIG. 3 illustrates a cross-sectional view of a semiconductor device 300 in which a plurality of transistors (e.g., transistors 301, 302, 303) are vertically stacked on top of one another. Each of the transistors 301 to 303 may be substantially similar to the semiconductor device 200 described with respect to FIGS. 2A-2G. In some embodiments, the same metal may be used for gate electrodes and source/drain electrodes of the transistors 301 to 303. In some other embodiments, the respective gate/source/drain electrodes of the transistors 301 to 303 may be different from each other. With such a configuration, a 3D device may be manufactured by stacking any number of the transistor structures (e.g., transistors 301, 302, 303) or other devices, while remaining within the scope of the present disclosure. While connections between the devices are not shown, understood and known techniques may be used to connect the transistors to each other or to other circuit elements.

Figure 4A:
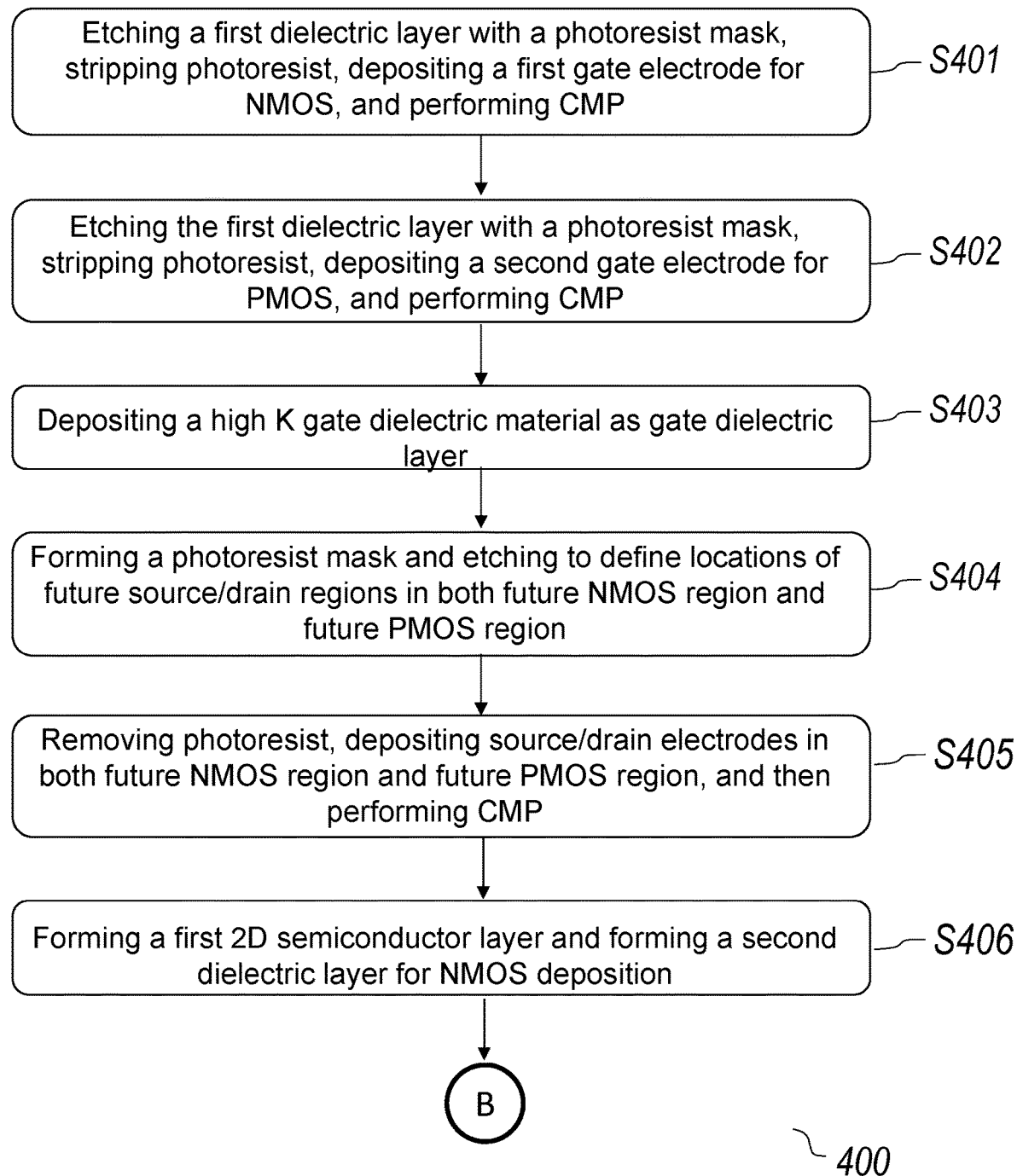
FIGS. 4A and 4B illustrate a flowchart of a process for forming an example semiconductor device, in accordance with some embodiments.
Figure 4B:
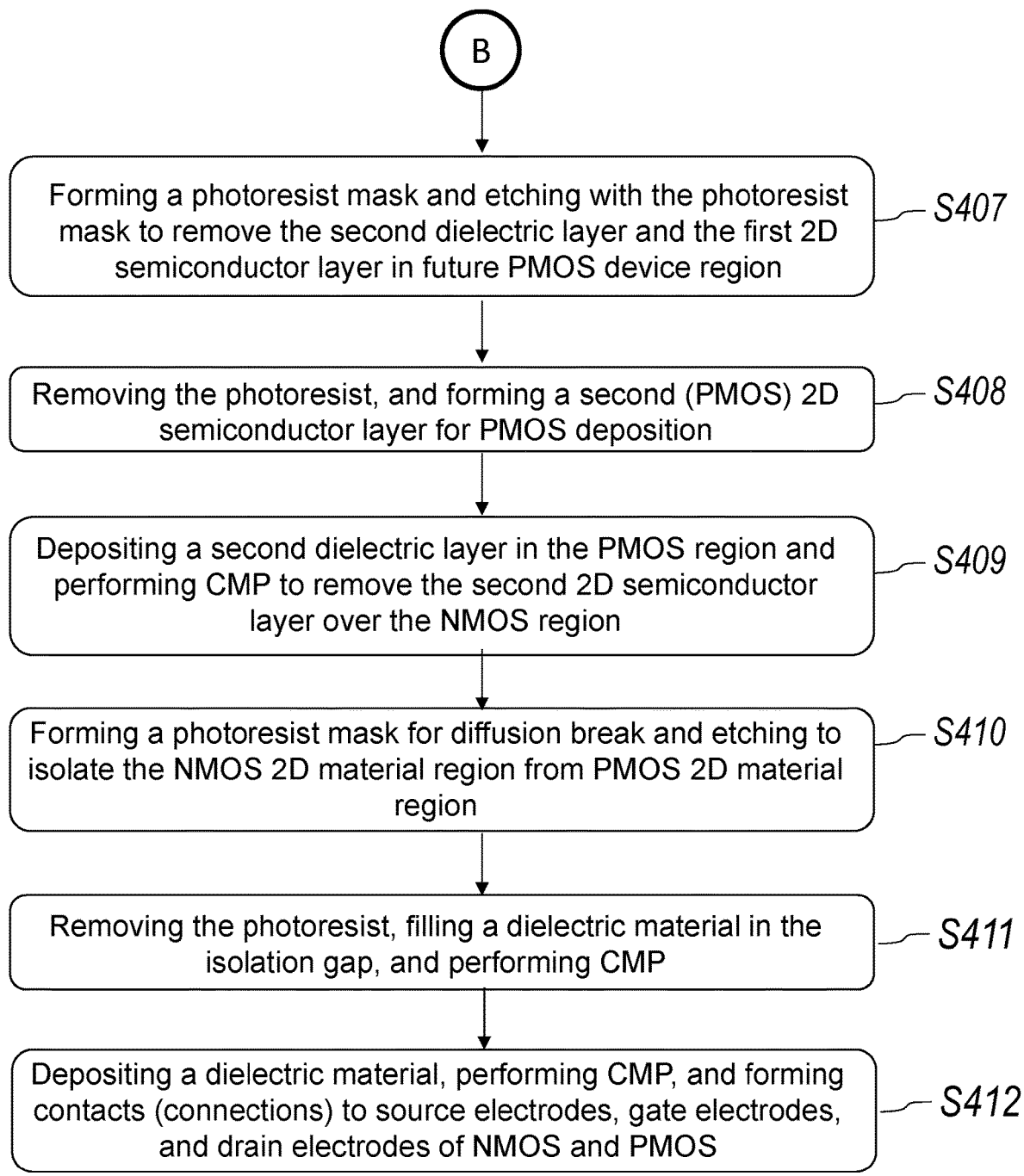

FIGS. 4A and 4B illustrate a flowchart of a process 400 for forming an example semiconductor device (e.g., transistor), in accordance with some embodiments. It is noted that the process 400 is merely an example, and is not intended to limit the present disclosure. Accordingly, it is understood that additional operations may be performed before, during, and after the process 400 of FIG. 4, and that some other operations may only be briefly described herein. In some embodiments, the process 400 may form 2D materials with inverted gate electrodes (e.g., gate electrodes 504, 554 in FIG. 5B) for high density 3D stacking.

FIGS. 5A-5L show cross-sectional views of a semiconductor device 500 being manufactured at different stages of the process of FIGS. 4A and 4B, in accordance with some embodiments.

Figure 5A:
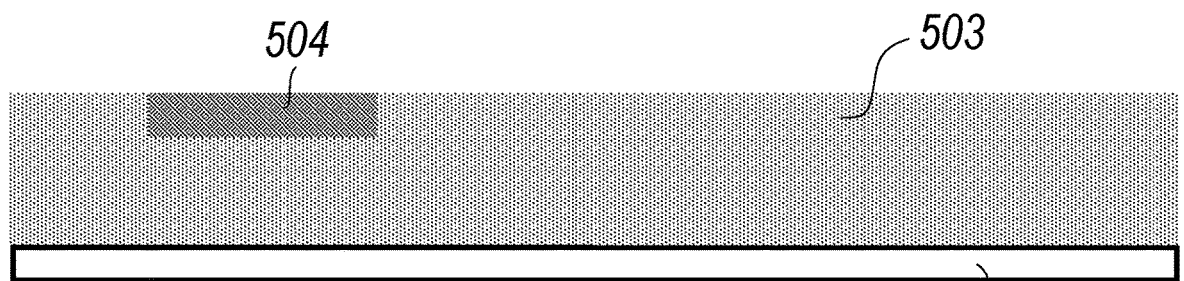
FIGS. 5A-5L show cross-sectional views of a semiconductor device being manufactured at different stages of the process of FIG. 4A and 4B, in accordance with some embodiments.
Figure 5B:
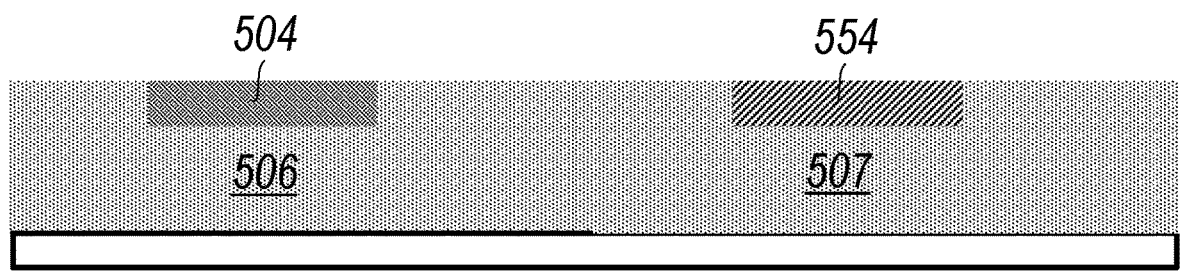
Figure 5C:
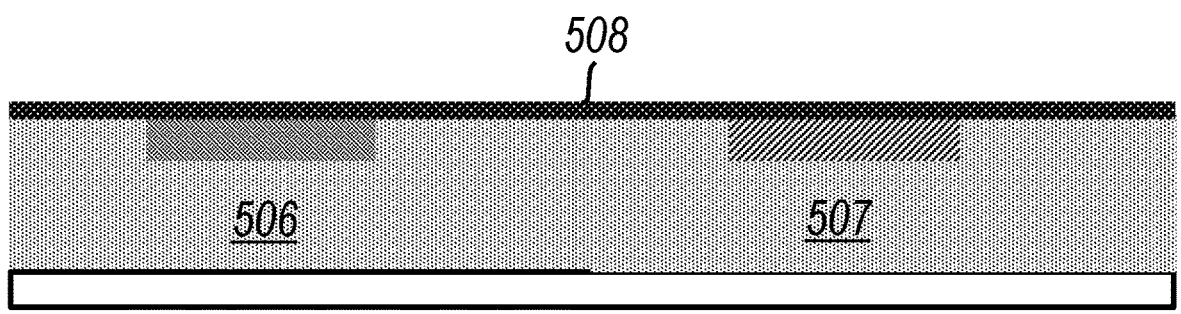
Figure 5D:
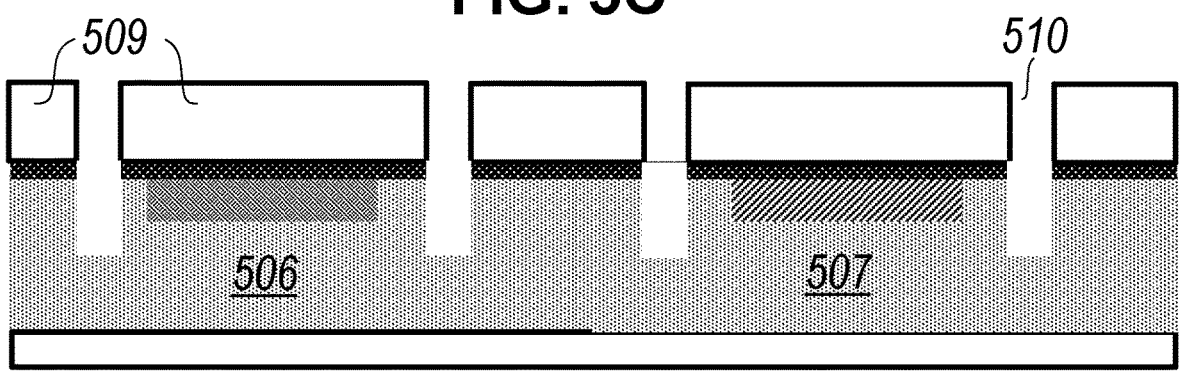
Figure 5E:
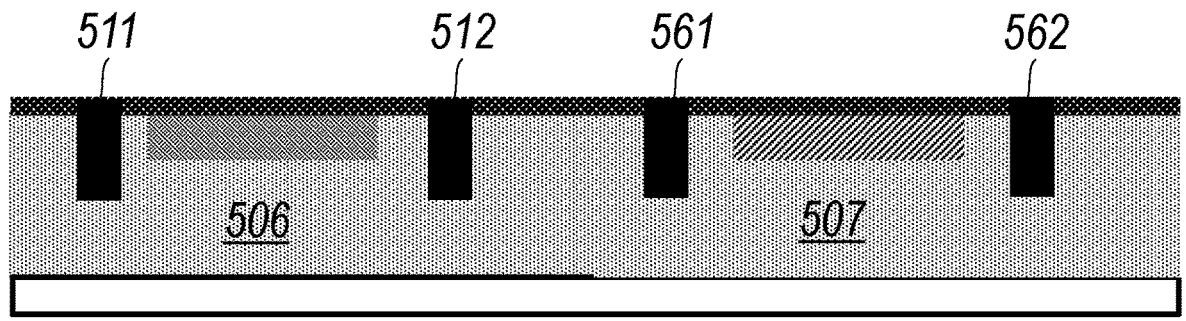
Figure 5F:
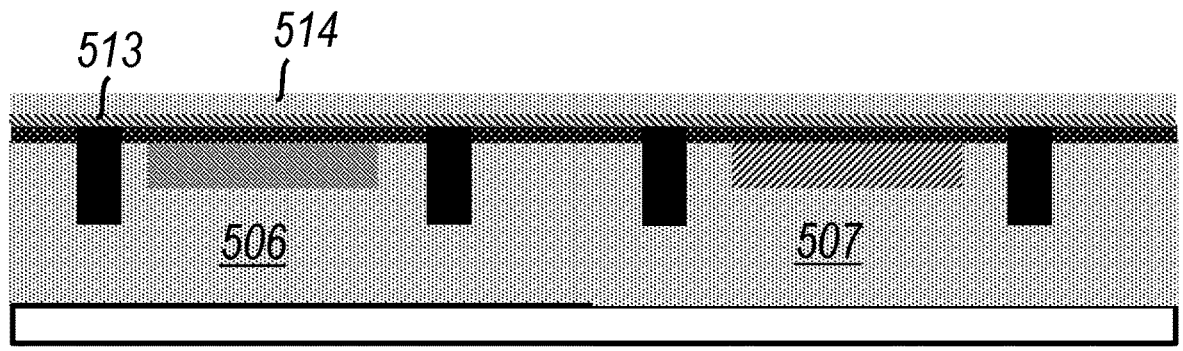
Figure 5G:
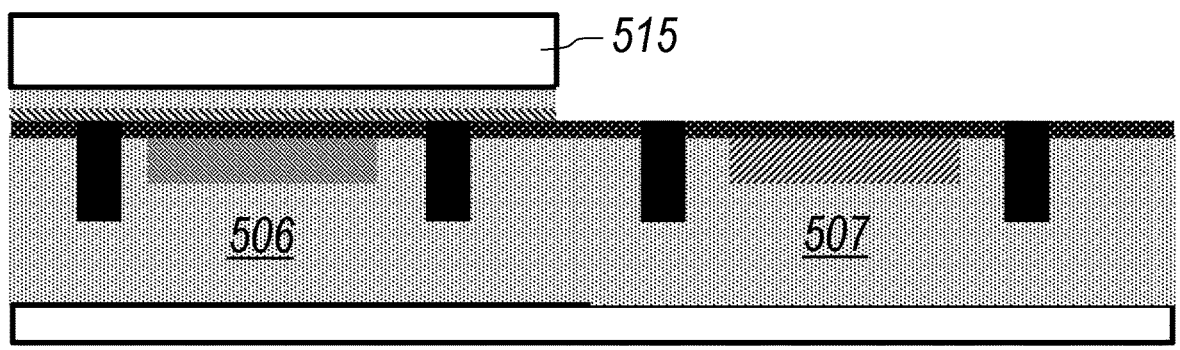
Figure 5H:
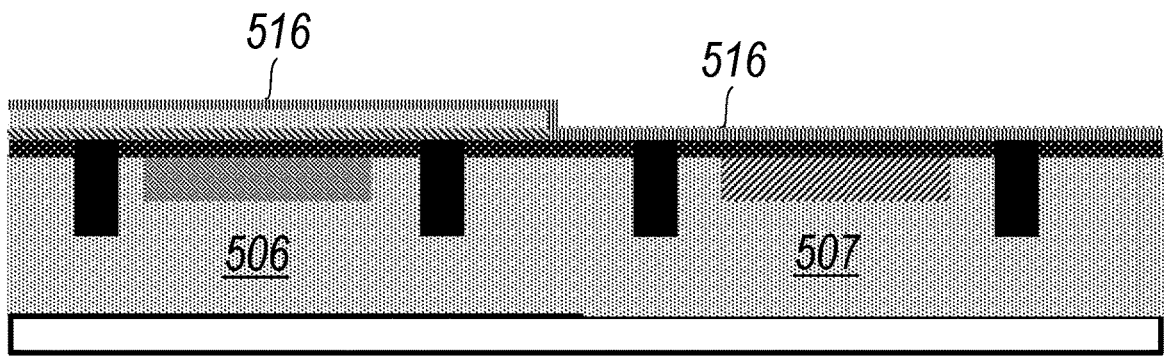
Figure 5I:
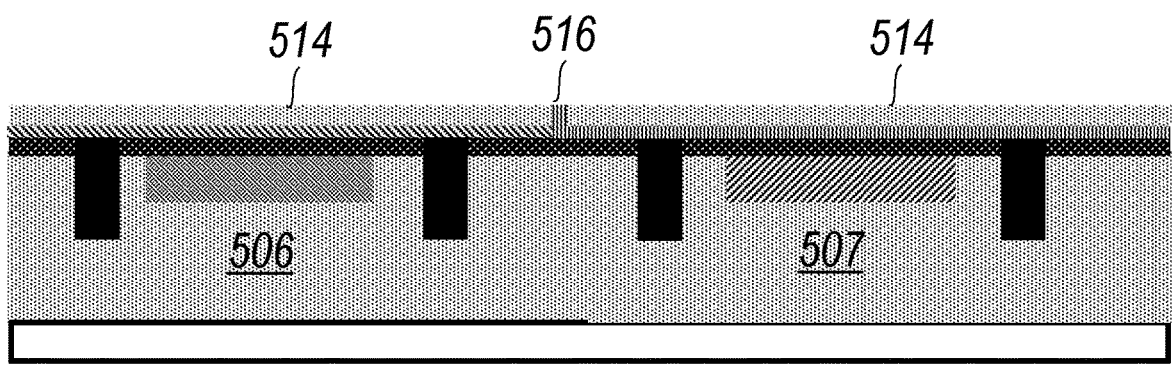
Figure 5J:
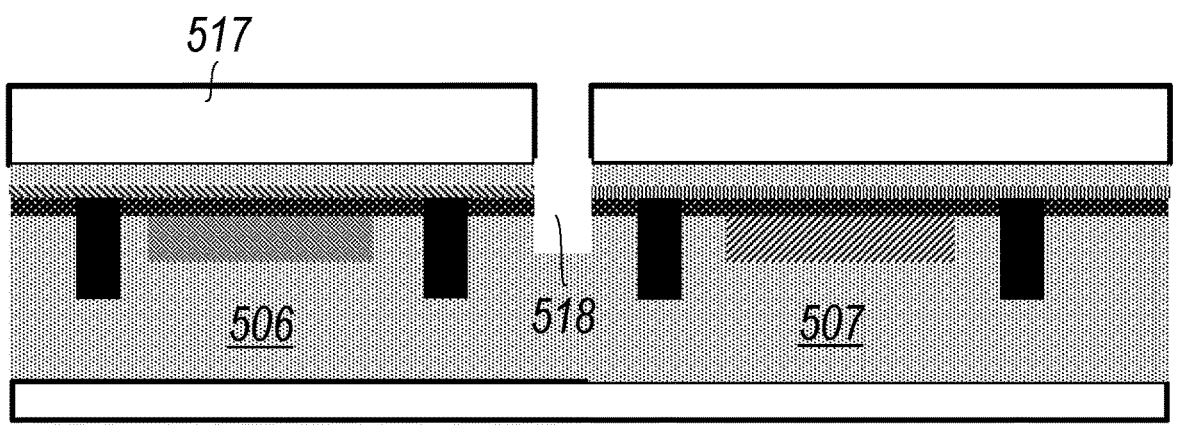
Figure 5K:
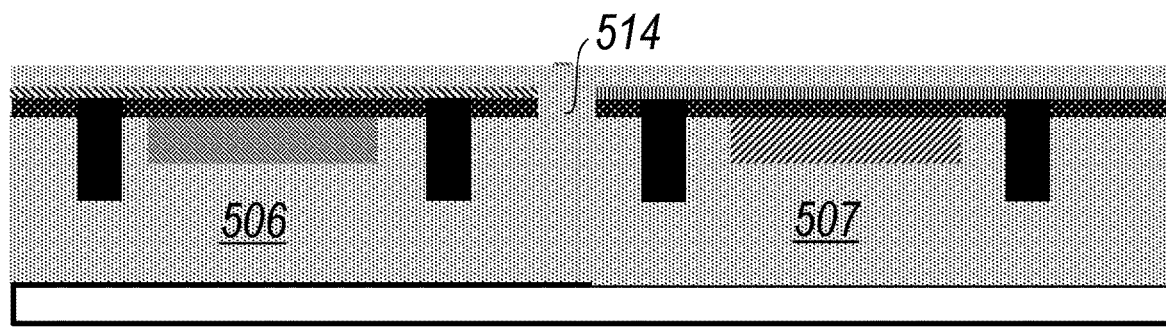
Figure 5L:
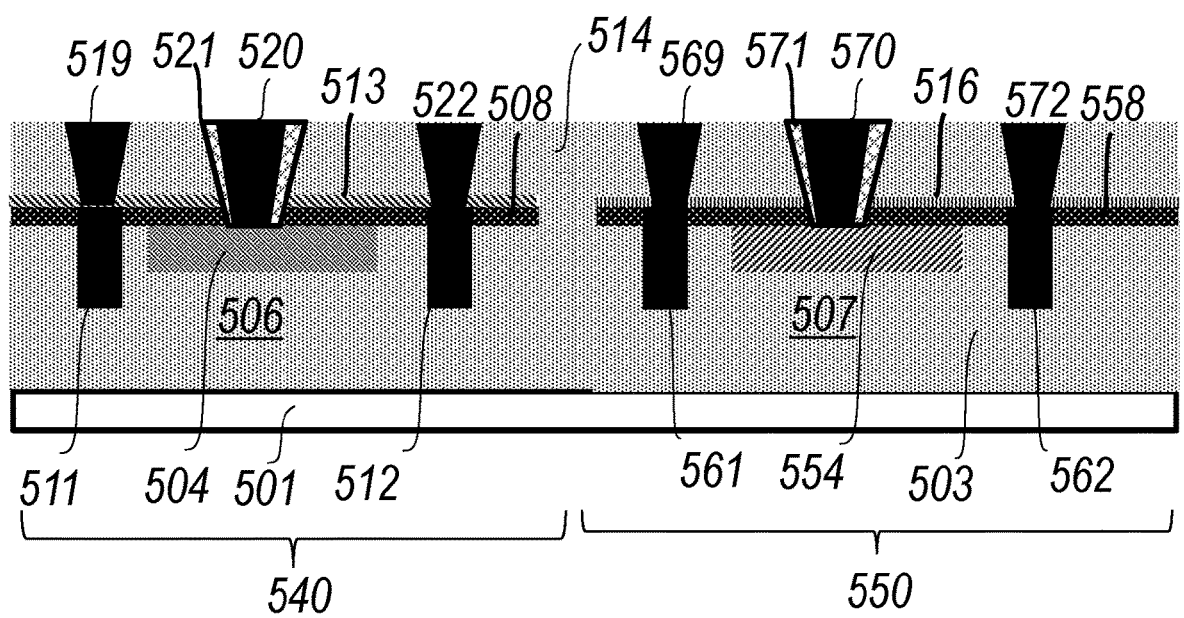

As shown in FIG. 5L, the semiconductor device 500 as a result of performing the process 400 according to some embodiments may be a CMOS transistor manufactured using a side-by-side structure in which two different conductive types of transistors are side-by-side or otherwise laterally formed or disposed.

Referring to FIG. 5L, the semiconductor device 500 may include a substrate 501, a first dielectric layer 503, and a second dielectric layer 514, in a first region (e.g., NMOS region) and in a second region (e.g., PMOS region). In the first region 506, the semiconductor device 500 may include a first gate electrode 504, a first source electrode 511, a first drain electrode 512, a first high-k gate dielectric material 508 (first gate dielectric layer), a first 2D semiconductor layer 513 (e.g., NMOS 2D semiconductor layer), a first source contact 519, a first gate contact 520, a first dielectric via liner 521, and/or a first drain contact 522. The semiconductor device 500 in the first region 506 may form a first transistor 540 (e.g., NMOS transistor). In the second region 507, the semiconductor device 500 may include a second gate electrode 554, a second source electrode 561, a second drain electrode 562, a second high-k gate dielectric material 558 (second gate dielectric layer), a second 2D semiconductor layer 516 (e.g., PMOS 2D semiconductor layer), a second source contact 569, a second gate contact 570, a second dielectric via liner 571, and/or a second drain contact 572. The semiconductor device 500 in the second region 507 may form a second transistor 550 (e.g., PMOS transistor).

In some embodiments, materials of each of the first 2D semiconductor layer 513 and the second 2D semiconductor layer 516 may be selected from the group consisting of: $WS_2$, $WSe_2$, $WTe_2$, $MoS_2$, $MoSe_2$, $MoTe_2$, $HfS_2$, $ZrS_2$, $TiS_2$, GaSe, InSe, phosphorene, and combinations thereof. Additional or alternative materials, such as the semiconductive oxides noted above, may be utilized to form the one or more semiconductor layers 513 and 516, and the materials may be the same or different for each depending on the type of devices being formed.

In some embodiments, the first gate electrode 520, the first source electrode 511, and the first drain electrode 512 may be terminals of a first transistor 540 having a first conductive type (e.g., NMOS). The semiconductor device 500 may further include a second transistor 550 having a second conductive type (e.g., PMOS) disposed in the first dielectric layer 503.

In some embodiments, the semiconductor device 500 (e.g., a side-by-side CMOS transistor) may use different metals for a gate electrode and source/drain electrodes of a transistor 500 in FIG. 5L). For example, a metal for the gate electrode 504 may be different from a metal for the source electrode 511 and the drain electrode 512. Similarly, a metal for the gate electrode 554 may be different from a metal for the source electrode 561 and the drain electrode 562. In some embodiments, the semiconductor device 500 may use different metals for a first gate electrode and a second gate electrode in different regions. For example, a metal for the gate electrode 504 in the first region 540 may be different from a metal for the gate electrode 554 in the second region 550.

Now, operations of the process 400 associated with cross-sectional views of an example semiconductor device at various fabrication stages as shown in FIGS. 5A-5L, respectively, will be discussed in further detail.

Corresponding to operation S401, FIG. 5A illustrates a resulting cross-sectional view of the semiconductor device after (1) etching a first dielectric layer 503 with a photoresist mask (not shown), (2) stripping the photoresist mask, (3) depositing a first gate electrode 504 for NMOS, and (4) performing CMP.

Corresponding to operation S402, FIG. 5B illustrates a resulting cross-sectional view of the semiconductor device after (1) etching the first dielectric layer 503 with a photoresist mask (not shown), stripping the photoresist mask, (3) depositing a second gate electrode 554 for PMOS, and (4) performing CMP. In some embodiments, a metal for the second gate electrode 554 may be different from a metal for the first gate electrode 504. In some embodiments, the first gate electrode 504 and the second gate electrode 554 may be formed to recess into a first area 506 and a second area 507 of a first dielectric layer 503, respectively. The gate electrodes 504 and 554 may be of similar dimensions or they may have different dimensions in the x-,y-, or z-directions.

Corresponding to operation S403, FIG. 5C illustrates a resulting cross-sectional view of the semiconductor device after depositing a high-k gate dielectric material 508 as gate dielectric layer. In some embodiments, the first gate dielectric layer 508 may be disposed on the first gate electrode 504, the second gate electrode 554 and the first dielectric layer 503.

Corresponding to operation S404, FIG. 5D illustrates a resulting cross-sectional view of the semiconductor device after forming a photoresist mask 509 and etching the first gate dielectric layer 508 and the first dielectric layer 503 to form trenches 510 which define locations of (1) future source/drain regions in the first area 506 (e.g., future NMOS region) and (2) future source/drain regions in the second area 507 (e.g., future PMOS region).

Corresponding to operation S405, FIG. 5E illustrates a resulting cross-sectional view of the semiconductor device after (1) removing the photoresist mask 509, (2) depositing source/drain electrodes 511, 512 in the future NMOS region 506, (3) depositing source/drain electrodes 561, 562 in the future PMOS region 507, and then (4) performing CMP. In some embodiments, a metal for the source/drain electrodes 511, 512 may be different from a metal for the first gate electrode 504, and a metal for the source/drain electrodes 561, 562 may be different from a metal for the second gate electrode 554. In some embodiments, the first source electrode 511 and the first drain electrode 512 may be formed to extend through the first gate dielectric layer 508 and into the first area 506 of the first dielectric layer 503. Similarly, the second source electrode 561 and the second drain electrode 562 may be formed to extend through the first gate dielectric layer 508 and into the second area 507 of the first dielectric layer 503.

Corresponding to operation S406, FIG. 5F illustrates a resulting cross-sectional view of the semiconductor device after forming a first 2D semiconductor layer 513 and forming a second dielectric layer 514 for NMOS deposition. In some embodiments, the first 2D semiconductor layer 513 may be formed or disposed on the first gate dielectric layer 508 at least in the first area 506 of the first dielectric layer 503. The first 2D semiconductor layer 513 may be formed or disposed on the first gate dielectric layer 508, overlying the first gate electrode 504. Referring to FIG. 5F, the thickness of the first 2D semiconductor layer 513 is not drawn to scale followed by the second dielectric layer 514 (dielectric deposition cap layer).

Corresponding to operation S407, FIG. 5G illustrates a resulting cross-sectional view of the semiconductor device after (1) forming a photoresist mask 515 and (2) etching the second dielectric layer 514 and the first 2D semiconductor layer 513 with the photoresist mask to remove the second dielectric layer 514 and the first 2D semiconductor layer 513 in the first area 506 (e.g., the future PMOS device region). In this manner, the first 2D semiconductor layer 513 may be formed in the first area 506 of the first dielectric layer (e.g., the future NMOS device region).

Corresponding to operation S408, FIG. 5H illustrates a resulting cross-sectional view of the semiconductor device after (1) removing the photoresist mask 515, and (2) forming a second (PMOS) 2D semiconductor layer 516 for PMOS deposition. In some embodiments, the second 2D semiconductor layer 516 may be formed or disposed (1) on the second dielectric layer 514 in the first area 506 and (2) on the first gate dielectric layer 508 in the second area 507.

Corresponding to operation S409, FIG. 5I illustrates a resulting cross-sectional view of the semiconductor device after (1) depositing a second dielectric layer 514 in the second area 507 (e.g., PMOS region) and (2) performing CMP to remove the second 2D semiconductor layer on the first area (e.g., NMOS region). As shown in FIG. 5I, as a result of performing CMP, the second dielectric layer 514 may be formed on the first 2D semiconductor layer 513 and the second 2D semiconductor layer 516. In this manner, after the first 2D semiconductor layer 513 is formed in the first area 506, the second 2D semiconductor layer 516 may be formed in the second area 507.

Corresponding to operation S410, FIG. 5J illustrates a resulting cross-sectional view of the semiconductor device after (1) forming a photoresist mask 517 for diffusion break and (2) etching the second dielectric layer 514 and the first and second 2D semiconductor layers to form an isolation gap or trench 518 to isolate the NMOS 2D material region (in the first area 506) from PMOS 2D material region (in the second area 507). In some embodiments, An isolation gap or trench 518 may be formed to extend through the second dielectric layer 514, the first 2D semiconductor layer 513 and the second 2D semiconductor layer 516 into a third area of the first dielectric layer 503. In some implementations, the third area of the first dielectric layer may be between the first area 506 and the second area 507.

Corresponding to operation S411, FIG. 5K illustrates a resulting cross-sectional view of the semiconductor device after (1) removing the photoresist mask 517, (2) filling a dielectric material in the isolation gap 518, and (3) performing CMP.

Corresponding to operation S412, FIG. 5L illustrates a resulting cross-sectional view of the semiconductor device 500 after (1) depositing a dielectric material on the second dielectric layer 514, (2) performing CMP, (3) forming a first source contact (connection) 519, a first gate contact 520 and a first drain contact 522 in contact with the first source electrode 511, the first gate electrode 504, and the first drain electrode 512, respectively, in the first area (e.g., NMOS region), and (4) forming a second source contact (connection) 569, a second gate contact 570 and a second drain contact 572 in contact with the second source electrode 561, the second gate electrode 554, and the second drain electrode 572, respectively, in the second area (e.g., PMOS region). In some embodiments, the dielectric via liner 571 may be formed such that it is around the first gate contact 520, and the dielectric via liner 571 may be formed such that it is around the second gate contact 570. In this manner, the first gate electrode 504, the first source electrode 511, and the first drain electrode 512 may be terminals of a first transistor 540 having a first conductive type (e.g., NMOS).

Similarly, the second gate electrode 554, the second source electrode 561, and the second drain electrode 562 may be terminals of a second transistor 550 having a second conductive type (e.g., PMOS). In some embodiments, the second transistor 550 having the second conductive type (e.g., PMOS) may be formed to be disposed in the first dielectric layer 503.

Figure 6:
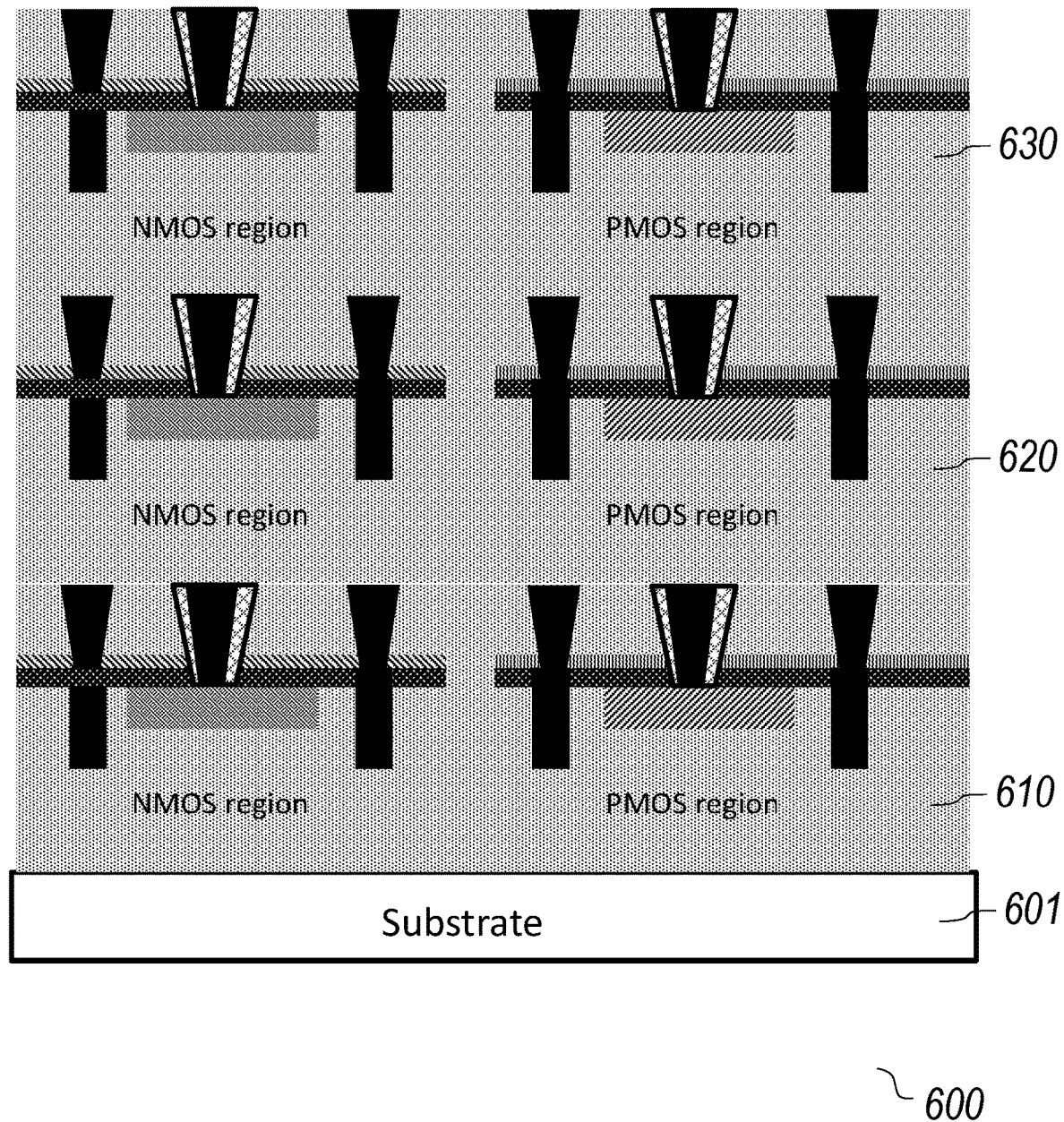
FIG. 6 illustrates a cross-sectional view of a semiconductor device in accordance with some embodiments.

FIG. 6 illustrates a cross-sectional view of a semiconductor device 600 in which a plurality of semiconductor devices 610, 620, 630 are vertically stacked on a substrate 610. In some embodiments, each of the plurality of semiconductor devices 610, 620, 630 is substantially similar to the side-by-side CMOS transistor 500 described with respect to FIGS. 5A-5L. With such a configuration, a 3D device may be manufactured by stacking any number of the transistors (e.g., semiconductor devices 610, 620, 630), while remaining within the scope of the present disclosure. It is noteworthy that the devices at each level of this stack need not be identical to the device aligned in the z-direction. Thus, in addition to the stack of NMOS and PMOS devices shown, the stack could have alternating CMOS and PMOS or may be otherwise customized as required for a given circuit design. Moreover, the gate electrode materials, 2D materials, gate dielectrics, and the device dimensions may be customized for each device in each level of the stack.

Figure 7:
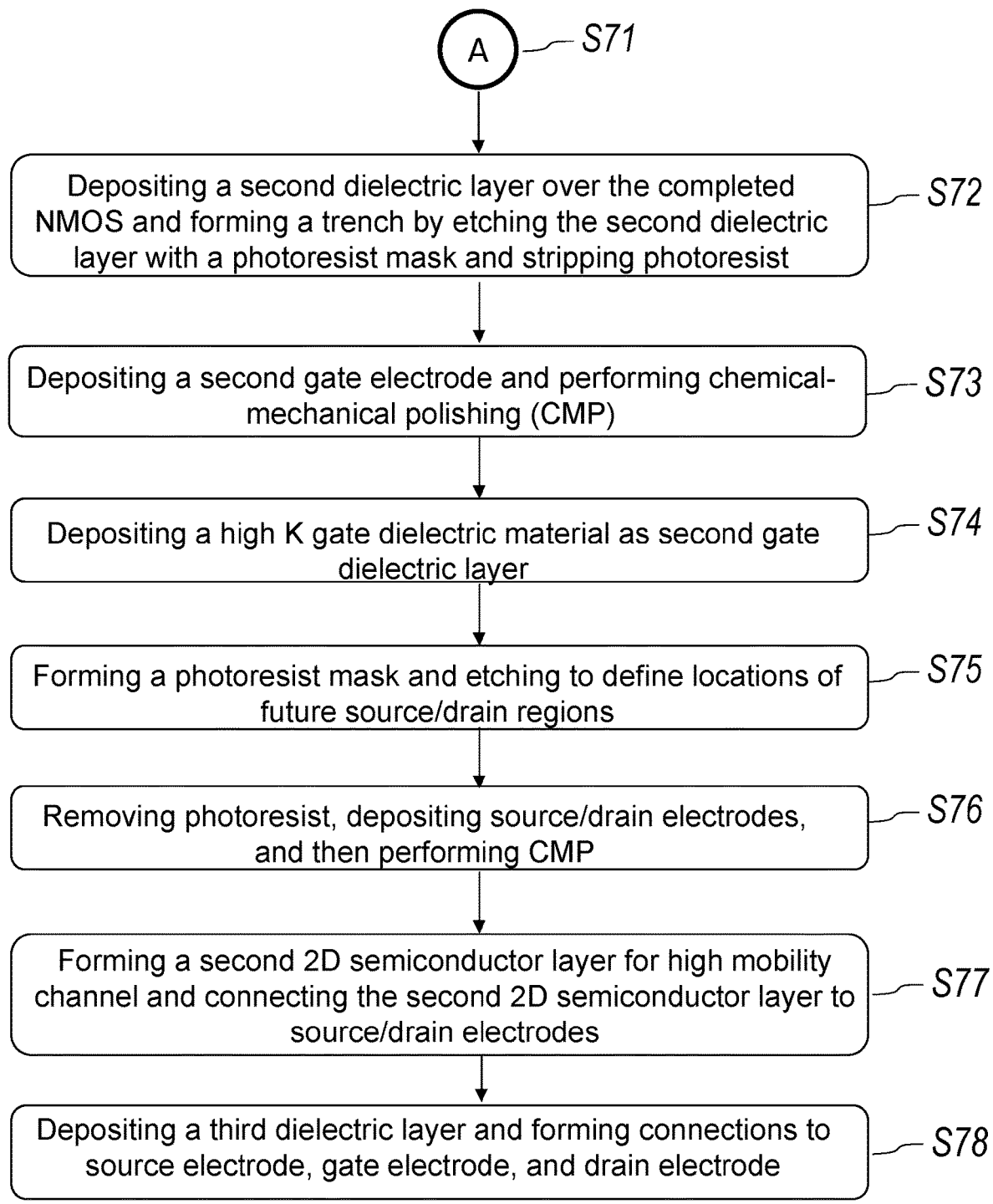
FIG. 7 illustrates a flowchart of a process for forming an example semiconductor device, in accordance with some embodiments.

FIG. 7 illustrates a flowchart of a process 700 for forming an example semiconductor device (e.g., transistor), in accordance with some embodiments. It is noted that the process 700 is merely an example and is not intended to limit the present disclosure. Accordingly, it is understood that additional operations may be performed before, during, and after the process 700 of FIG. 7, and that some other operations may only be briefly described herein.

Figure 8A:
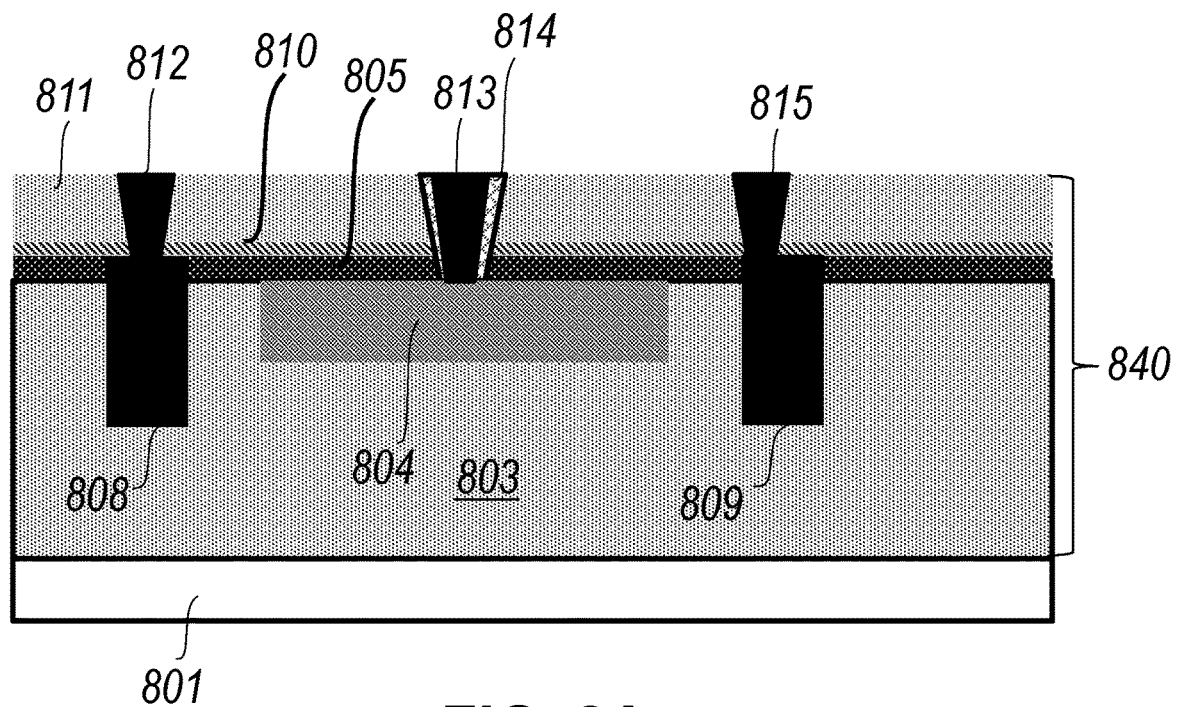
FIGS. 8A-8C show cross-sectional views of a semiconductor device being manufactured at different stages of the process of FIG. 7, in accordance with some embodiments.
Figure 8B:
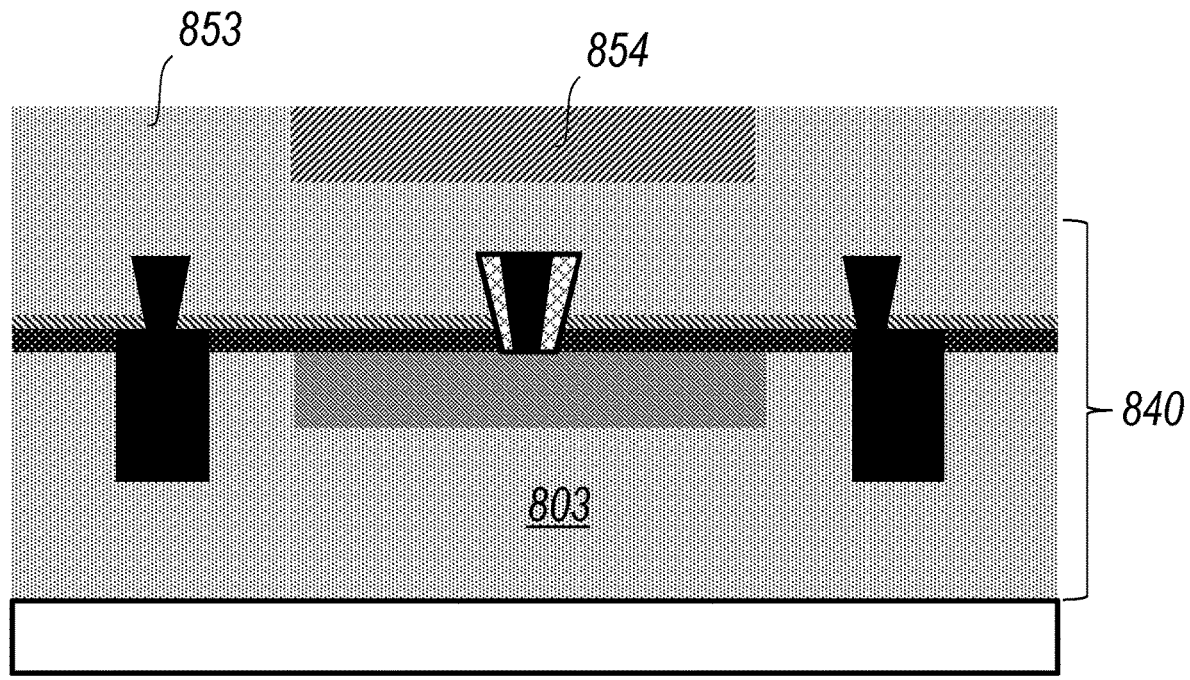
Figure 8C:
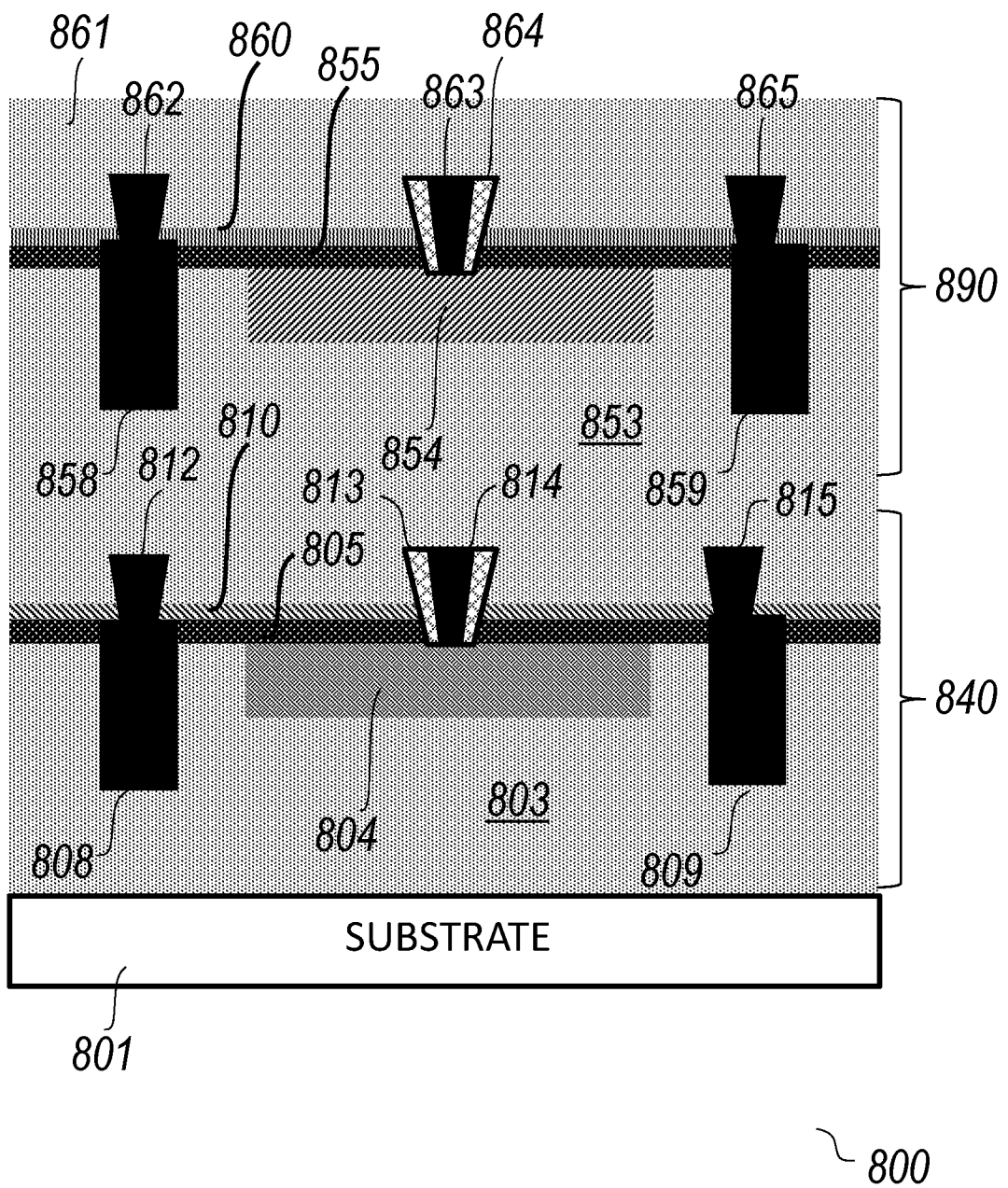

FIGS. 8A-8C show cross-sectional views of a semiconductor device 800 being manufactured at different stages of the process of FIG. 7, in accordance with some embodiments. In some embodiments, the semiconductor device 800 may be a CFET device (e.g., PMOS device over NMOS device, or NMOS device over PMOS device). The process 700 may form 2D materials (e.g., 2D semiconductor layer 810, 860 in FIG. 8C) with an inverted gate electrode (e.g., gate electrode 803, 854 in FIG. 8C) for high density 3D stacking (e.g., a plurality of semiconductor devices 910, 920, 930, 940, 950, 960 being vertically stacked in FIG. 9). The process 700 may first complete a first semiconductor device (e.g., NMOS device) and then repeat a similar process for forming a second semiconductor device (e.g., PMOS device) over the first semiconductor device, and so on.

As shown in FIG. 8C, the semiconductor device 800 as a result of performing the process 700 according to some embodiments may be a CFET transistor (e.g., PMOS stacked over NMOS).

The semiconductor device 800 may include a substrate 801, a first semiconductor device 840 (e.g., NMOS transistor), and a second semiconductor device 890 (e.g., PMOS transistor). In some embodiments, the first semiconductor device 840 may include a first dielectric layer 803, a first gate electrode 804, a first source electrode 808, a first drain electrode 809, a first high-k gate dielectric material 805 (first gate dielectric layer), a first 2D semiconductor layer 810 (e.g., NMOS 2D semiconductor layer), a first source contact 812, a first gate contact 814, a first dielectric via liner 813, a first drain contact 815, and/or a second dielectric layer 853. In some embodiments, the second semiconductor device 890 may include the second dielectric layer 853, a second gate electrode 854, a second source electrode 858, a second drain electrode 859, a second high-k gate dielectric material 855 (second gate dielectric layer), a second 2D semiconductor layer 860 (e.g., PMOS 2D semiconductor layer), a second source contact 862, a second gate contact 864, a second dielectric via liner 863, and/or a second drain contact 865, and/or a third dielectric layer 861.

In some embodiments, each of the first 2D semiconductor layer 810 and the second 2D semiconductor layer 860 may be selected from the group consisting of: $WS_2$, $WSe_2$, $WTe_2$, $MoS_2$, $MoSe_2$, $MoTe_2$, $HfS_2$, $ZrS_2$, $TiS_2$, GaSe, InSe, phosphorene, $In_2O_3$, $SnO_2$, InGaZnO, ZnO, SnO, and combinations thereof.

In some embodiments, in each semiconductor device, different metals may be used for gate electrode and source/drain electrodes. For example, a metal for the first gate electrode 804 may be different from a metal for the first source electrode 808 and/or the first drain electrode 809. In some embodiments, different metals may be used for gate electrodes of different semiconductor devices. For example, a metal for the first gate electrode 804 may be different from a metal for the second gate electrode 854.

Now, operations of the process 700 associated with cross-sectional views of an example semiconductor device at various fabrication stages as shown in FIGS. 8A-8C, respectively, is described in further detail herein below.

Corresponding to operation S71, FIG. 8A illustrates a resulting cross-sectional view of the semiconductor device 800 after completing a first semiconductor device 840 (e.g., NMOS transistor) by performing steps similar to steps S11 to S17 in FIG. 1. Referring to FIG. 8A, the semiconductor device 800 may include a substrate 801 and the semiconductor device 840. The semiconductor device 840 may include a first dielectric layer 803, a gate electrode 804 (first gate electrode), a high-k gate dielectric material 805 (first gate dielectric layer), a source electrode 808, a drain electrode 809, a first 2D semiconductor layer 810, another dielectric layer 811, a first source contact 812, a first gate contact 813, a first dielectric via liner 814, and/or first drain contact 815.

Corresponding to operation S72, FIG. 8B illustrates a resulting cross-sectional view of the semiconductor device 800 after (1) depositing a dielectric material to form a second dielectric layer 853 on the completed first semiconductor device 840, (2) forming a trench (not shown) by etching the second dielectric layer 853 with a photoresist mask (not shown), (3) stripping photoresist mask, (4) depositing a second gate electrode 854, and (5) performing chemical-mechanical polishing (CMP). In some embodiments, the second gate electrode 854 may be formed by filling the trench with a metal (e.g., PMOS metal gate) different from a metal for the first gate electrode 804. In some embodiments, the process 700 may optionally offset the PMOS metal gate.

Corresponding to operation S73 to S77, FIG. 8C illustrates a resulting cross-sectional view of the semiconductor device 800 after (1) depositing a high-k gate dielectric material 855 as second gate dielectric layer (S73); (2) forming a photoresist mask (not shown) and etching to define locations of future source/drain regions (S74); (3) removing the photoresist mask, depositing second source/drain electrodes 858, 859, and then performing CMP (S75); (4) forming a second 2D semiconductor layer 860 on the second gate dielectric layer 855 for high mobility channel and connecting the second 2D semiconductor layer 860 to the second source/drain electrodes 858, 859 (S76); and/or (5) depositing a third dielectric layer 861 and forming connections, e.g., a second source contact 862, a second gate contact 863 with a second dielectric via liner 864, and a second drain contact 865, in contact with the second source electrode 858, the second gate electrode 854, and the second drain electrode 859, respectively (S77). In some embodiments, the second gate electrode 854 and the second 2D semiconductor layer 860 may be a PMOS gate electrode and a PMOS 2D semiconductor layer, respectively. In some embodiments, the second gate dielectric layer 855 may use a high-k dielectric material different from the high-k dielectric material of the first gate dielectric layer 805. In some embodiments, the second gate dielectric layer 855 may have a thickness different from the thickness of the first gate dielectric layer 805. In some embodiments, the semiconductor device 800 may further include one or more dielectric layers 853 disposed on the first 2D semiconductor layer 810, and one or more transistors 890 disposed in respective ones of the one or more dielectric layers 853.

Referring to FIG. 8C, one or more transistors 840, 890 may be formed to be disposed in respective ones of the one or more dielectric layers 803, 853 to alternatively arrange at least one transistor having the first conductive type (e.g., NMOS transistor 840) and at least one transistor having a second conductive type (e.g., PMOS transistor 890).

Figure 9:
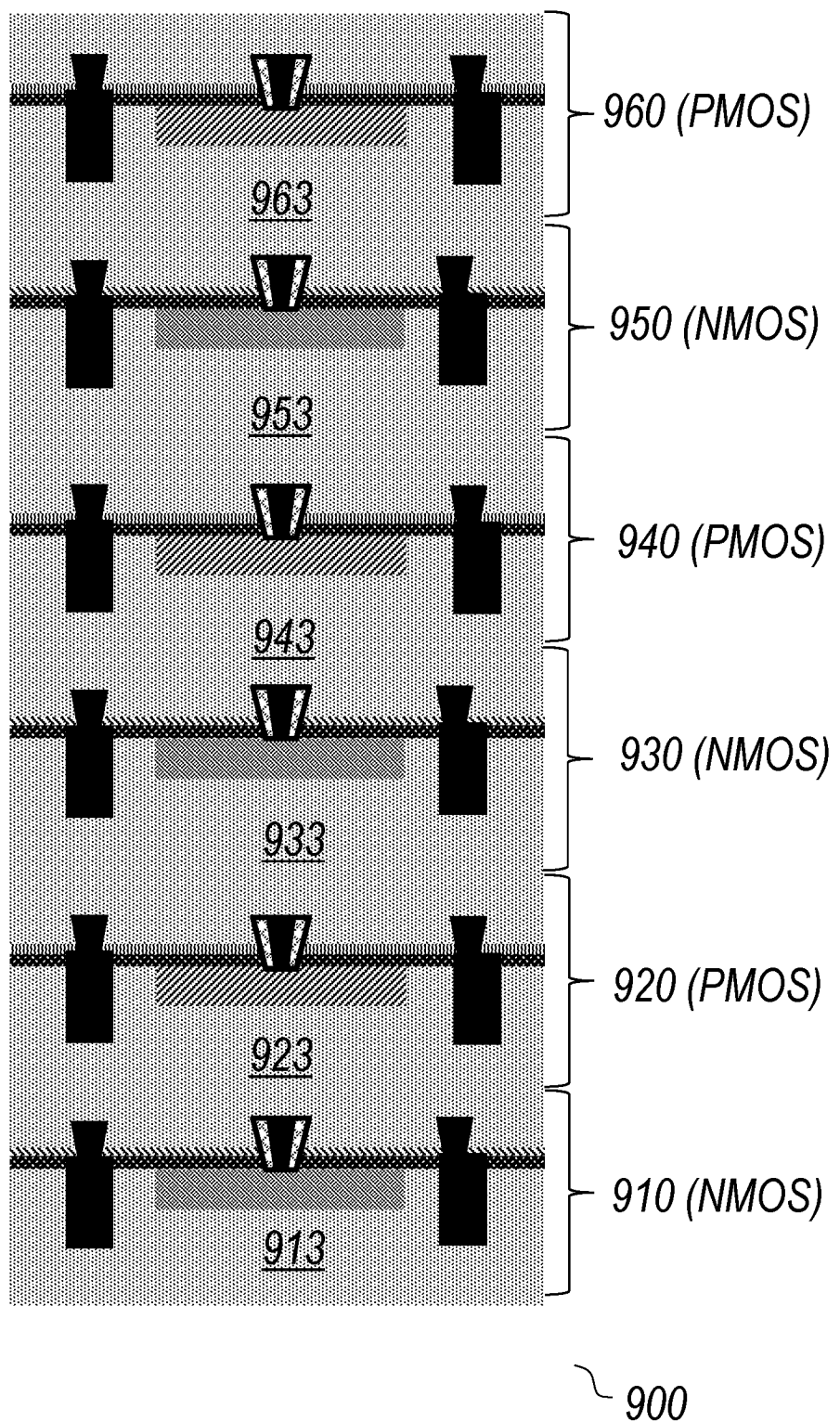
FIG. 9 illustrates a cross-sectional view of a semiconductor device in accordance with some embodiments.

FIG. 9 illustrates a cross-sectional view of a semiconductor device 900 in which one or more transistors 910, 920, 930, 940, 950, 960 may be formed to be disposed in respective ones of the one or more dielectric layers 913, 923, 933, 943, 953, 963 to alternatively arrange at least one transistor having the first conductive type (e.g., NMOS transistors 910, 930, 950) and at least one transistor having a second conductive type (e.g., PMOS transistors 920, 940, 960). In some embodiments, the semiconductor device 900 may include three CFET transistors (e.g., three NMOS-PMOS pairs) with total 6 devices (or transistors). Although the semiconductor device 800 and the semiconductor device 900 show one or more CFET transistors, each including PMOS over NMOS, embodiments of the present disclosure are not limited thereto. In some embodiments, a semiconductor device may have one or more CFET transistors, each including NMOS over PMOS.

Referring to FIG. 8C, in some embodiments, a CFET 800 may be manufactured in a unit cell using one or more 2D materials (e.g., 2D semiconductor layers 810, 860), including a PMOS 890 stacked over a NMOS 840. In some embodiments, a CFET may include a NMOS stacked over a PMOS. Referring to FIG. 9, in some embodiments, a 3D device 900 may be manufactured by stacking a plurality of CFETs (e.g., three pairs of NMOS and PMOS in FIG. 9) each being manufactured using one or more 2D materials.

Figure 10:
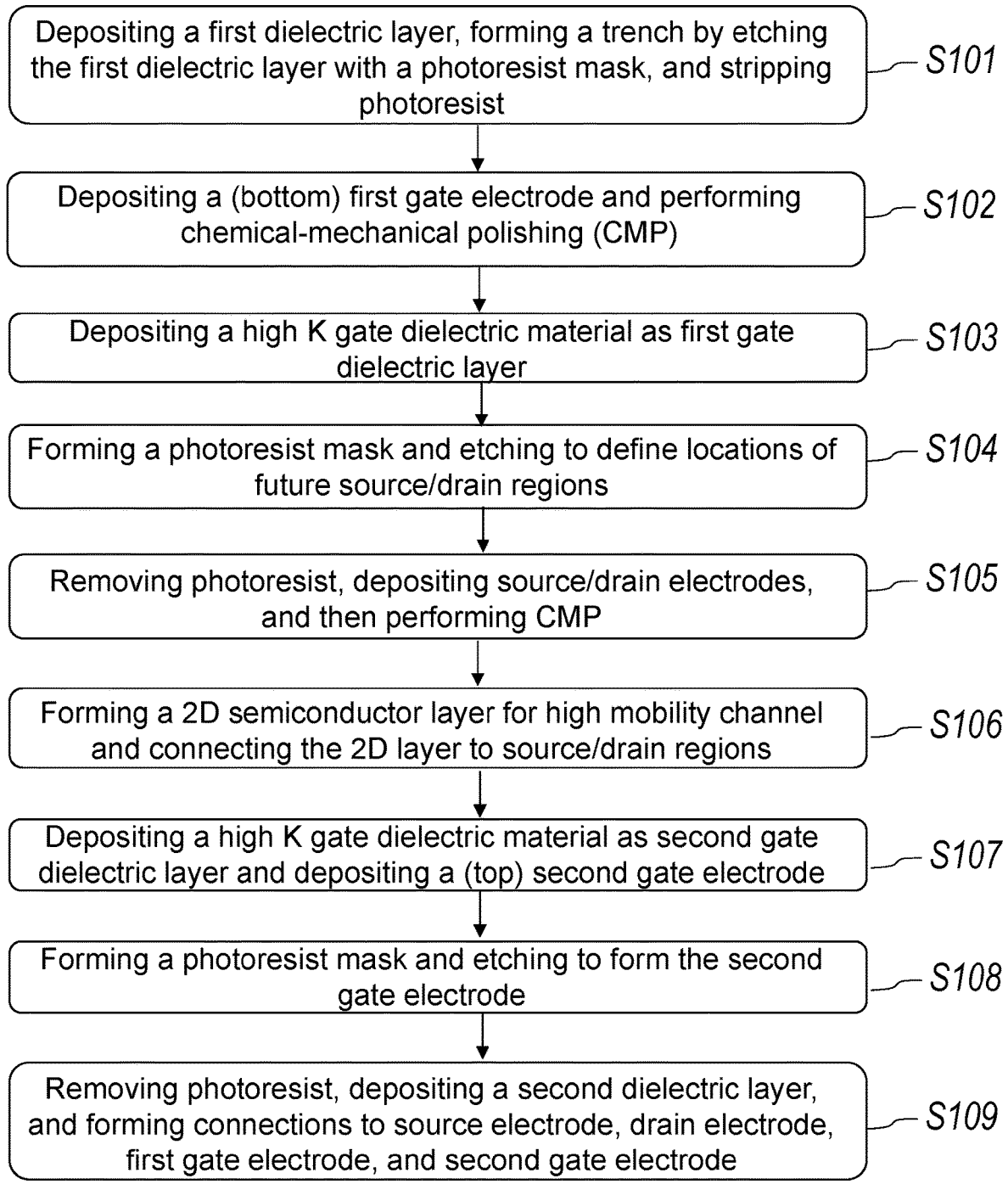
FIG. 10 illustrates a flowchart of a process for forming an example semiconductor device, in accordance with some embodiments.

FIG. 10 illustrates a flowchart of a process 1000 for forming an example semiconductor device (e.g., transistor), in accordance with some embodiments. It is noted that the process 1000 is merely an example and is not intended to limit the present disclosure. Accordingly, it is understood that additional operations may be performed before, during, and after the process 1000 of FIG. 10, and that some other operations may only be briefly described herein. In some embodiments, the process 1000 may form a semiconductor device (e.g., a transistor 1100 in FIG. 11I) by using 2D materials (e.g., 2D semiconductor layer 1110 in FIG. 11I) with an inverted gate electrode (e.g., gate electrode 1104 in FIG. 11I) for high density 3D stacking. In some embodiments, the semiconductor device may have a dual gate (e.g., two gate electrodes 1104 and 1112 disposed on two sides of a 2D semiconductor layer 1110; see FIG. 11I).

FIGS. 11A-11I show cross-sectional views of a semiconductor device being manufactured at different stages of the process of FIG. 10, in accordance with some embodiments.

Figure 11A:
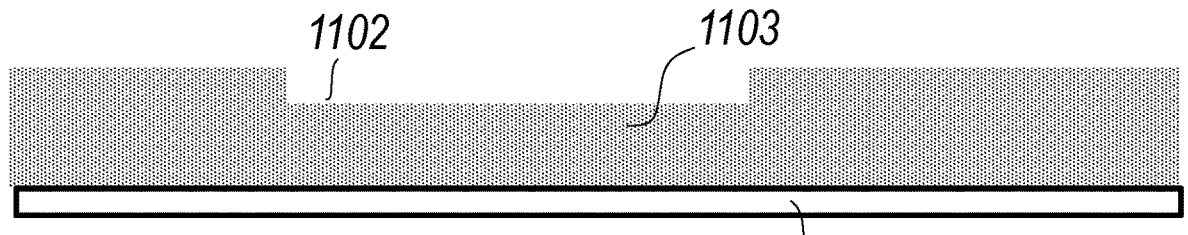
FIG. 11A-11I show cross-sectional views of a semiconductor device being manufactured at different stages of the process of FIG. 10, in accordance with some embodiments.
Figure 11B:
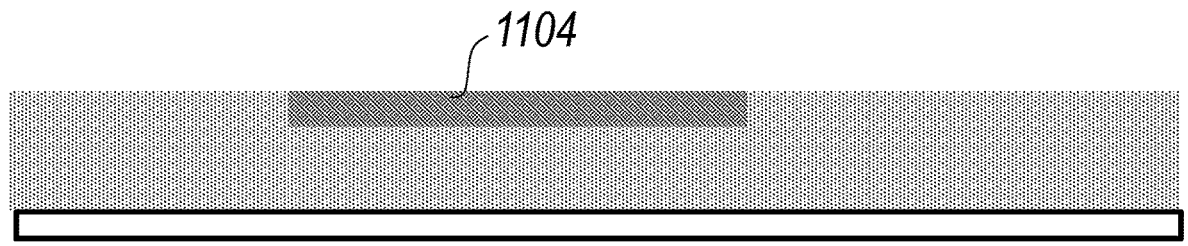
Figure 11C:
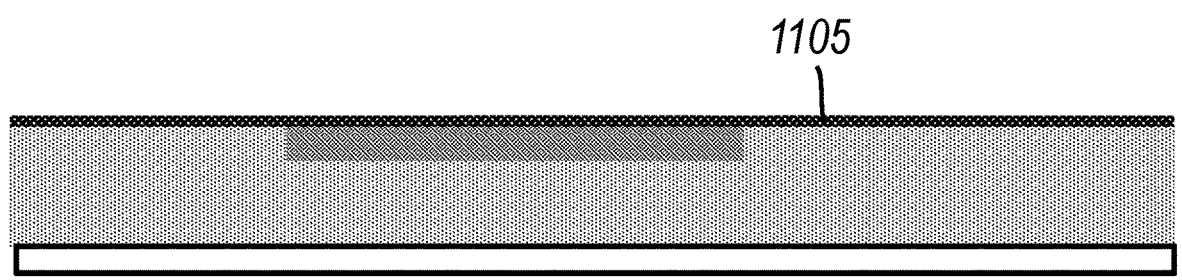
Figure 11D:
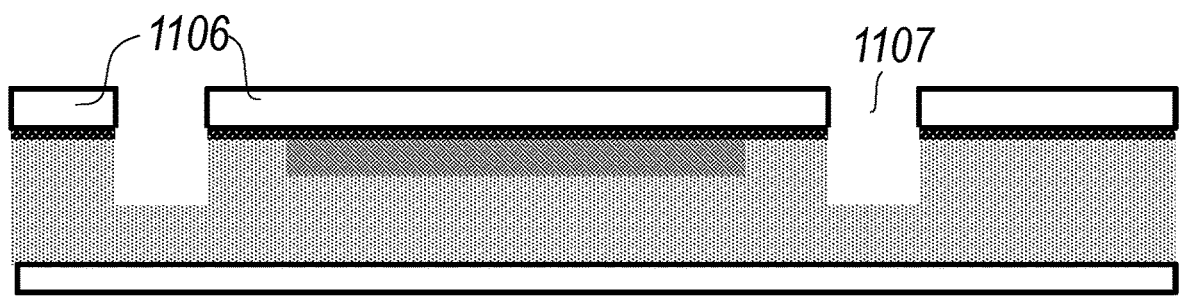
Figure 11E:
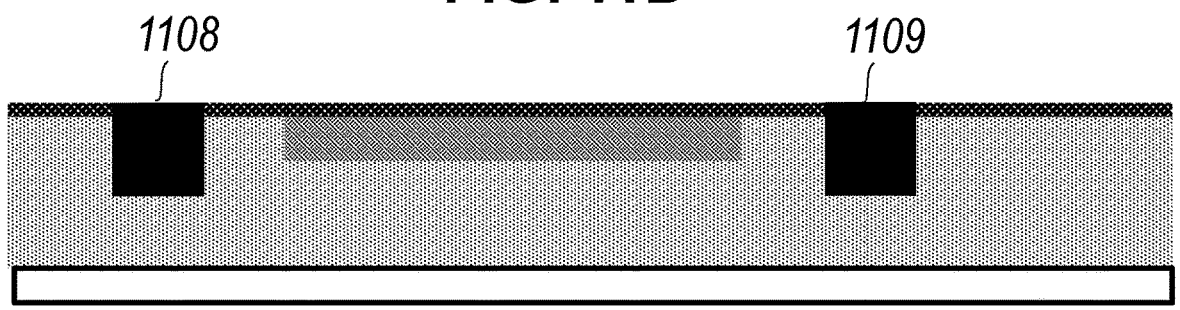
Figure 11F:
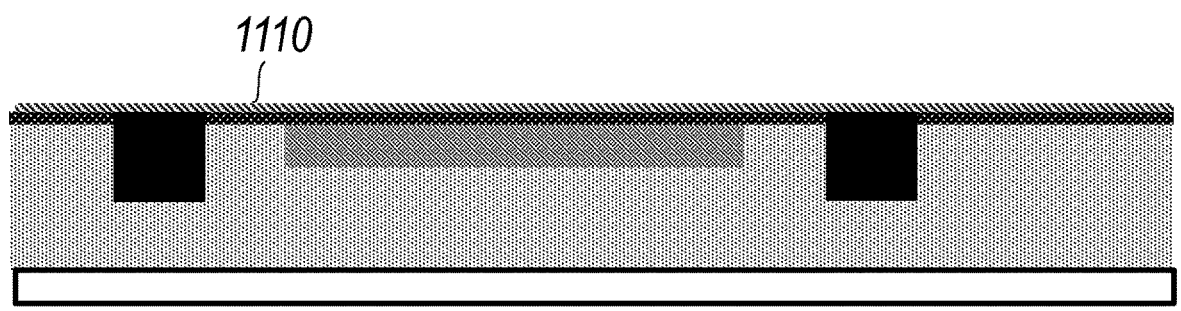
Figure 11G:
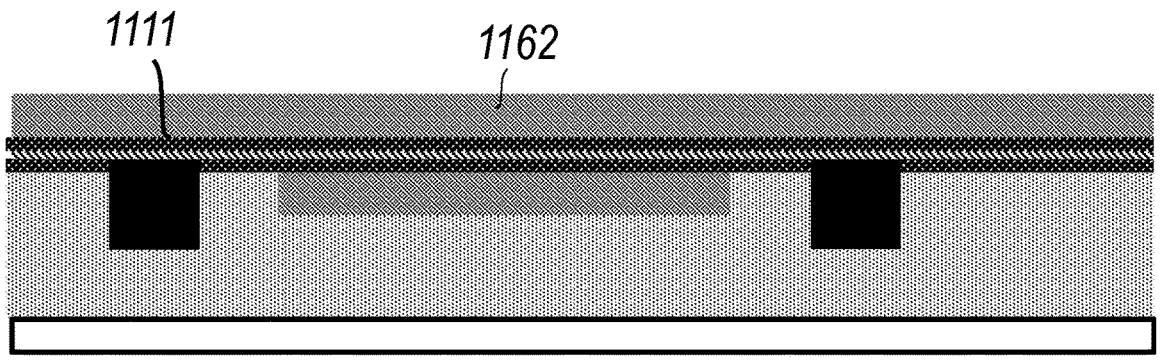
Figure 11H:
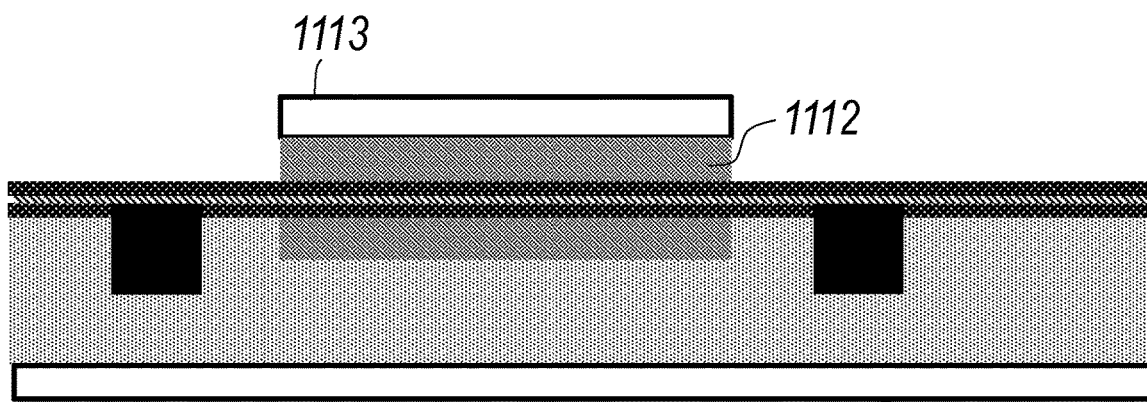
Figure 11I:
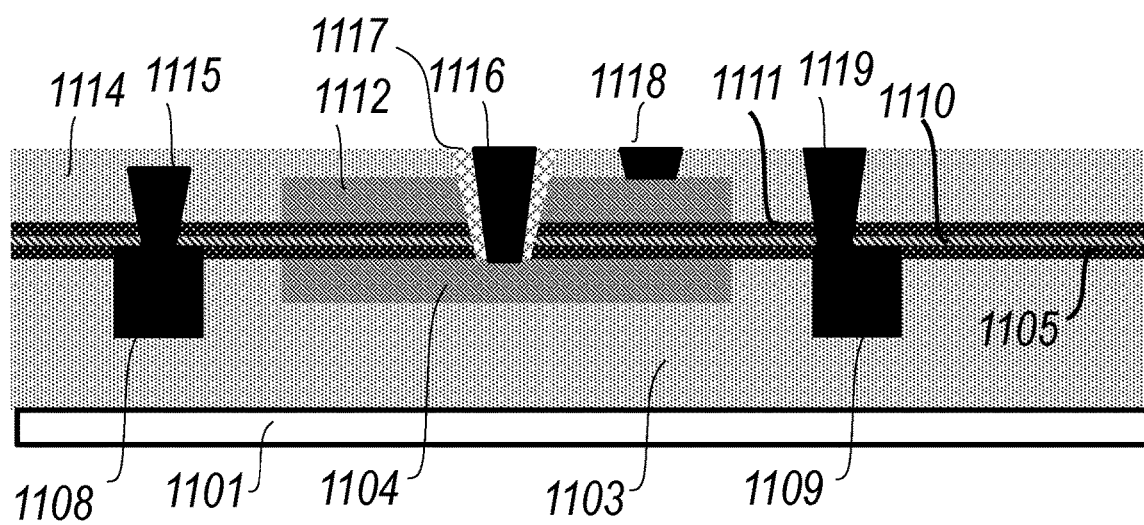

As shown in FIG. 11I, a semiconductor device 1100 as a result of performing the process 1000 according to some embodiments may include a transistor with a dual gate, manufactured using a structure in which some of the electrodes (e.g., source, one of the gates, drain) is formed or disposed on one side of a channel (e.g., 2D semiconductor layer 1110) and the other gate is formed or disposed on the other side of the channel.

Referring to FIG. 11I, the semiconductor device 1100 may include a substrate 1101, a first dielectric layer 1103, a first gate electrode 1104 (first gate electrode), a first high-k gate dielectric material 1105 (first gate dielectric layer), a first source electrode 1108, a first drain electrode 1109, a 2D semiconductor layer 1110, a second high-k gate dielectric material 1111 (second gate dielectric layer), a second gate electrode 1112, a second dielectric layer 1114, a first source contact 1115, a first gate contact 1116, a first dielectric via liner 1117, a second gate contact 1118, and/or a drain contact 1119. The second gate electrode 1112 may be formed to be disposed on the second gate dielectric layer 1111 in the second dielectric layer 1114.

In some embodiments, materials of the 2D semiconductor layer 1110 may be selected from the group consisting of: $WS_2$, $WSe_2$, $WTe_2$, $MoS_2$, $MoSe_2$, $MoTe_2$, $HfS_2$, $ZrS_2$, $TiS_2$, GaSe, InSe, phosphorene, $In_2O_3$, $SnO_2$, InGaZnO, ZnO, SnO, and combinations thereof. Alternative materials for the 2D semiconductor layer 1110 may be utilized.

In some embodiments, the second gate dielectric layer 1111 may be disposed on the first 2D semiconductor layer 210. The second dielectric layer 1114 may be disposed on the second gate dielectric layer 1111. The second gate electrode 1112 may be disposed on the second gate dielectric layer 1111 in the second dielectric layer 1114.

In some embodiments, a metal for the first gate electrode 1104 may be different from a metal for the source/drain electrodes 1108, 1109. In some embodiments, a metal for the second gate electrode 1112 may be different from a metal for the source/drain electrodes 1108, 1109. In some embodiments, a metal for the first gate electrode 1104 may be the same as a metal for the second gate electrode 1112.

Now, operations of the process 1000 associated with cross-sectional views of an example semiconductor device at various fabrication stages as shown in FIGS. 11A-11I, respectively, will be discussed in further detail.

Corresponding to operation S101, FIG. 11A illustrates a resulting cross-sectional view of the semiconductor device 1100 after (1) depositing a first dielectric layer 1103 on the substrate 1101, (2) forming a trench 1102 by etching the first dielectric layer 1103 with a photoresist mask (not shown), and (3) stripping the photoresist mask.

Corresponding to operation S102, FIG. 11B illustrates a resulting cross-sectional view of the semiconductor device 1100 after depositing a (bottom) first gate electrode 1104 in the trench 1102, and (2) performing chemical-mechanical polishing (CMP). In some embodiments, the first gate electrode 1104 may include a stack of different metals.

Corresponding to operation S103, FIG. 11C illustrates a resulting cross-sectional view of the semiconductor device 1100 after depositing a high-k gate dielectric material 1105 as first gate dielectric layer on the first dielectric layer 1103 and the first gate electrode 1104.

Corresponding to operation S104, FIG. 11D illustrates a resulting cross-sectional view of the semiconductor device 1100 after (1) forming a photoresist mask 1106 and (2)

etching the first gate dielectric layer 1105 and the first dielectric layer 1103 to form trenches 1107, which define locations of future source/drain regions.

Corresponding to operation S105, FIG. 11E illustrates a resulting cross-sectional view of the semiconductor device 1100 after (1) removing the photoresist mask 1106, (2) depositing metals in the trenches 1107 to form a source electrode 1108 and a drain electrode 1109, and then (3) performing CMP. In some embodiments, the metals for the source/drain electrodes 1108, 1109 may be different for the metal for the first gate electrode 1104.

Corresponding to operation S106, FIG. 11F illustrates a resulting cross-sectional view of the semiconductor device 1100 after (1) forming a 2D semiconductor layer 1110 for high mobility channel on the first gate dielectric layer 1105, and (2) connecting the 2D semiconductor layer 1110 to the source/drain electrodes 1108, 1109. In this manner, the process 1000 may manufacture a perfectly planar device due to the inverted gate electrode feature.

Corresponding to operation S107, FIG. 11G illustrates a resulting cross-sectional view of the semiconductor device 1100 after (1) depositing a high-k gate dielectric material 1111 as second gate dielectric layer on the 2D semiconductor layer 1110, and (2) depositing a metal 1162 on the second gate dielectric layer 1111 to form a (top) second gate electrode 1112.

Corresponding to operation S108, FIG. 111I illustrates a resulting cross-sectional view of the semiconductor device 1100 after (1) forming a photoresist mask 1113 and (2) etching the metal 1162 to form the second gate electrode 1112.

Corresponding to operation S109, FIG. 11I illustrates a resulting cross-sectional view of the semiconductor device 1100 after (1) removing the photoresist mask 1113, (2) depositing a second dielectric layer 1114, and (3) forming connections to the source electrode 1108, the drain electrode 1109, the first gate electrode 1104, and the second gate electrode 1112. In some embodiments, the process 1000 may form a first source contact 1115, a first gate contact 1116 with a first dielectric via liner 1117, and a drain contact 1119 in contact with the source electrode 1108, the drain electrode 1109, and the first gate electrode 1104, respectively. In some embodiments, the process 1000 may form a second gate contact 1118 in contact with the second gate electrode 1112. In some embodiments, the first dielectric via liner 1117 may be formed such that it is around the first gate contact 1116.

Figure 12:
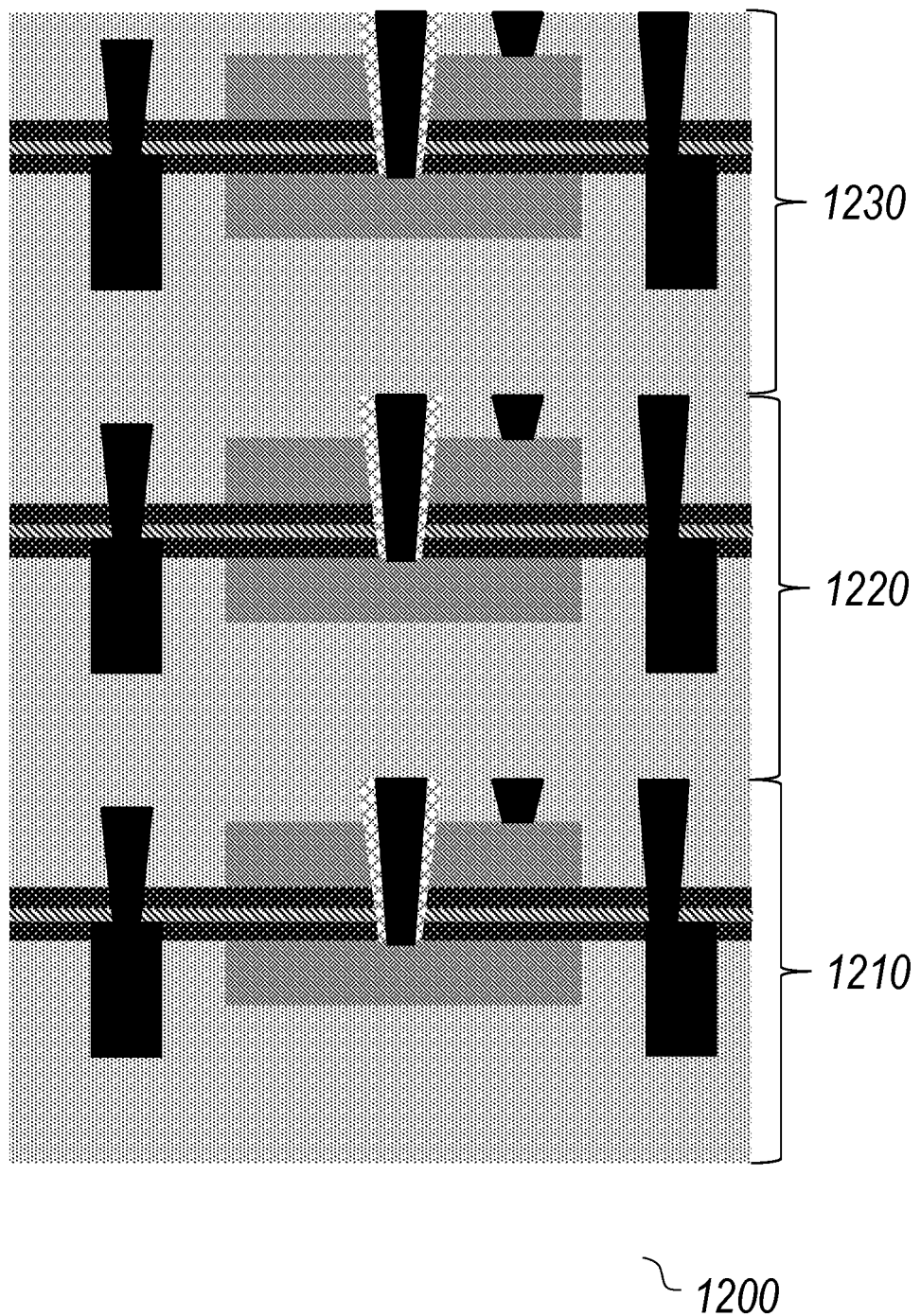
FIG. 12 illustrates a cross-sectional view of a semiconductor device in accordance with some embodiments.

FIG. 12 illustrates a cross-sectional view of a semiconductor device 1200 in which a plurality of semiconductor devices 1210, 1220, 1230, each being manufactured using a dual gate structure, e.g., the semiconductor device 1100 shown in FIGS. 11A-11I.

Having now described some illustrative implementations and implementations, it is apparent that the foregoing is illustrative and not limiting, having been presented by way of example. In particular, although many of the examples presented herein involve specific combinations of method acts or system elements, those acts and those elements may be combined in other ways to accomplish the same objectives. Acts, elements and features discussed only in connection with one implementation are not intended to be excluded from a similar role in other implementations or implementations.

The phraseology and terminology used herein is for the purpose of description and should not be regarded as limiting. The use of "including" "comprising" "having" "containing" "involving" "characterized by" "characterized in that" and variations thereof herein, is meant to encompass the items listed thereafter, equivalents thereof, and additional items, as well as alternate implementations consisting of the items listed thereafter exclusively. In one implementation, the systems and methods described herein consist of one, each combination of more than one, or all of the described elements, acts, or components.

"Substrate" or "target substrate" as used herein generically refers to an object being processed in accordance with the present disclosure. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Any references to implementations or elements or acts of the systems and methods herein referred to in the singular may also embrace implementations including a plurality of these elements, and any references in plural to any implementation or element or act herein may also embrace implementations including only a single element. References in the singular or plural form are not intended to limit the presently disclosed systems or methods, their components, acts, or elements to single or plural configurations. References to any act or element being based on any information, act or element may include implementations where the act or element is based at least in part on any information, act, or element.

Any implementation disclosed herein may be combined with any other implementation, and references to "an implementation," "some implementations," "an alternate implementation," "various implementation," "one implementation" or the like are not necessarily mutually exclusive and are intended to indicate that a particular feature, structure, or characteristic described in connection with the implementation may be included in at least one implementation. Such terms as used herein are not necessarily all referring to the same implementation. Any implementation may be combined with any other implementation, inclusively or exclusively, in any manner consistent with the aspects and implementations disclosed herein.

References to "or" may be construed as inclusive so that any terms described using "or" may indicate any of a single, more than one, and all of the described terms.

Where technical features in the drawings, detailed description or any claim are followed by reference signs, the reference signs have been included for the sole purpose of increasing the intelligibility of the drawings, detailed description, and claims. Accordingly, neither the reference signs nor their absence have any limiting effect on the scope of any claim elements.

The preceding description of the disclosed embodiments is provided to enable any person skilled in the art to make or use the embodiments described herein and variations thereof. Various modifications to these embodiments will be readily apparent to those skilled in the art, and the principles defined herein may be applied to other embodiments without departing from the spirit or scope of the subject matter disclosed herein. Thus, the present disclosure is not intended to be limited to the embodiments shown herein but is to be accorded the widest scope consistent with the following claims and the principles and novel features disclosed herein.

While various aspects and embodiments have been disclosed, other aspects and embodiments are contemplated. The various aspects and embodiments disclosed are for purposes of illustration and are not intended to be limiting, with the true scope and spirit being indicated by the following claims.

What is claimed is:

1. A semiconductor device, comprising:
   a gate electrode;
   a gate dielectric layer disposed on the gate electrode;
   a two-dimensional (2D) semiconductor layer disposed on the gate dielectric layer;
   a source electrode extending through the gate dielectric layer to the 2D semiconductor layer;
   a drain electrode extending through the gate dielectric layer and to the 2D semiconductor layer; and
   a gate contact extending through the 2D semiconductor layer and the gate dielectric layer to the gate electrode.

2. The semiconductor device of claim 1, wherein a dielectric liner is disposed between the gate contact and the 2D semiconductor layer.

3. The semiconductor device of claim 1, wherein the gate electrode, the source electrode, and the drain electrode are terminals of a transistor structure having a conductive type.

4. The semiconductor device of claim 3, wherein the transistor structure is a first transistor structure, the device further comprising a second transistor structure disposed above the first transistor structure.

5. The semiconductor device of claim 4, wherein the transistor structure has a first conductive type, and the second transistor structure has a second conductive type.

6. The semiconductor device of claim 1, further comprising:
   a second gate dielectric layer disposed on the 2D semiconductor layer; and
   a second gate electrode disposed on the second gate dielectric layer.

7. A method for fabricating semiconductor devices, comprising:
   forming a gate electrode;
   forming a gate dielectric layer on the gate electrode;
   forming a source electrode and a drain electrode extending through the gate dielectric layer;
   forming a two-dimensional (2D) semiconductor layer disposed on the gate dielectric layer, the source electrode, and the drain electrode; and
   forming a gate contact extending through the 2D semiconductor layer and the gate dielectric layer to the gate electrode.

8. The method of claim 7, wherein forming the gate contact further comprises forming a dielectric along a sidewall of the 2D semiconductor layer, to insulate the gate contact from the 2D semiconductor layer.

9. The method of claim 7, wherein the gate electrode, the source electrode, and the drain electrode are terminals of a transistor structure.

10. The method of claim 9, wherein the transistor structure is a first transistor structure, the method further comprising forming a second transistor structure above the first transistor structure.

11. The method of claim 10, wherein the transistor structure has a first conductive type, and the second transistor structure has a second conductive type.

12. The method of claim 7, further comprising:
    forming a second gate dielectric layer on the 2D semiconductor layer; and
    forming a second gate electrode on the second gate dielectric layer.

13. A method for fabricating semiconductor devices, comprising:
    forming a first gate electrode;
    forming a second gate electrode;
    forming a gate dielectric layer extending across a top surface of the first gate electrode and the second gate electrode;
    forming a first source electrode and a first drain electrode extending through the gate dielectric layer;
    forming a second source electrode and a second drain electrode extending through the gate dielectric layer;
    forming a first two-dimensional (2D) semiconductor layer on the gate dielectric layer, overlying the first gate electrode; and
    forming a second 2D semiconductor layer on the gate dielectric layer, the second source electrode, and the second drain electrode,
    wherein after forming the first 2D semiconductor layer, the second 2D semiconductor layer is formed.

14. The method of claim 13, wherein the first 2D semiconductor layer includes a material selected from the group consisting of: $WS_2$, $WSe_2$, $WTe_2$, $MoS_2$, $MoSe_2$, $MoTe_2$, $HfS_2$, $ZrS_2$, $TiS_2$, GaSe, InSe, phosphorene, and combinations thereof.

15. The method of claim 13, further comprising isolating the first 2D semiconductor layer, the first gate electrode, the first source electrode, and the first drain electrode from the second 2D semiconductor layer, the second gate electrode, the second source electrode, and the second drain electrode.

16. The method of claim 13, wherein the first 2D semiconductor layer has a first conductive type, and the second semiconductive layer has a second conductive type.

17. The method of claim 13, further comprising:
    forming a first gate contact extending through, and insulated from, the first 2D semiconductor layer and the first gate dielectric layer to the first gate electrode;
    forming a first source contact extending through the first 2D semiconductor layer and the first gate dielectric layer to the first source electrode; and
    forming a first drain contact extending through the first 2D semiconductor layer and the first gate dielectric layer to the first drain electrode.

* * * * *